(12) United States Patent
Shen et al.

(10) Patent No.: US 11,789,218 B2
(45) Date of Patent: Oct. 17, 2023

(54) THREE-DIMENTIONAL PACKAGING METHOD AND PACKAGE STRUCTURE OF PHOTONIC-ELECTRONIC CHIP

(71) Applicant: Hangzhou Guangzhiyuan Technology Co., Ltd., Hangzhou (CN)

(72) Inventors: Yichen Shen, Hangzhou (CN); Samuel Jiang, Shanghai (CN); Shanshan Yu, Hangzhou (CN)

(73) Assignee: Hangzhou Guangzhiyuan Technology Co., Ltd., Hangzhou (CN)

( * ) Notice: Subject to any disclaimer, the term of this patent is extended or adjusted under 35 U.S.C. 154(b) by 0 days.

(21) Appl. No.: 17/731,868

(22) Filed: Apr. 28, 2022

(65) Prior Publication Data

US 2022/0365295 A1 Nov. 17, 2022

(30) Foreign Application Priority Data

Apr. 30, 2021 (CN) .......................... 202110480406.4

(51) Int. Cl.
| | | |
|---|---|---|
| *G02B 6/42* | (2006.01) | |
| *H01S 5/0234* | (2021.01) | |
| *H01S 5/02218* | (2021.01) | |
| *G02B 6/293* | (2006.01) | |
| *H01L 25/16* | (2023.01) | |
| *H01L 23/00* | (2006.01) | |

(52) U.S. Cl.
CPC ....... *G02B 6/4215* (2013.01); *G02B 6/29304* (2013.01); *G02B 6/424* (2013.01); *G02B 6/4239* (2013.01); *H01L 24/05* (2013.01); *H01L 24/13* (2013.01); *H01L 24/16* (2013.01); *H01L 24/17* (2013.01); *H01L 24/81* (2013.01); *H01L 25/167* (2013.01); *H01S 5/0234* (2021.01); *H01S 5/02218* (2021.01); *H01L 2224/0557* (2013.01); *H01L 2224/13025* (2013.01); *H01L 2224/16145* (2013.01); *H01L 2224/16227* (2013.01); *H01L 2224/17181* (2013.01); *H01L 2224/81986* (2013.01)

(58) Field of Classification Search
CPC ....................................................... H01L 24/05
See application file for complete search history.

(56) References Cited

U.S. PATENT DOCUMENTS

| | | |
|---|---|---|
| 2009/0256216 A1 | 10/2009 | Kierse |
| 2013/0292786 A1 | 11/2013 | Sengupta |

(Continued)

FOREIGN PATENT DOCUMENTS

| | | |
|---|---|---|
| CN | 101567321 | 10/2009 |
| CN | 103400808 | 11/2013 |

(Continued)

*Primary Examiner* — William A Harriston
(74) *Attorney, Agent, or Firm* — Fish & Richardson P.C.

(57) ABSTRACT

The present disclosure provides a three-dimensional packaging method and a three-dimensional package structure of a photonic-electronic chip. The method includes: fixing an electronic chip on a first area of a first surface of a photonic chip; fixing a dummy chip on a second area of the first surface of the photonic chip, wherein the photonic chip is provided with an optical coupling interface at the second area, and the dummy chip has a cavity with a single-sided opening, and the opening of the cavity faces and covers an optical coupling interface.

38 Claims, 9 Drawing Sheets

(56) References Cited

U.S. PATENT DOCUMENTS

2016/0116688 A1 4/2016 Hochberg et al.
2020/0003975 A1* 1/2020 Yu .......................... H01L 24/81

FOREIGN PATENT DOCUMENTS

| | | |
|---|---|---|
| CN | 205016524 | 2/2016 |
| CN | 106980159 | 7/2017 |
| CN | 108922855 | 11/2018 |
| CN | 110164984 | 8/2019 |
| CN | 110310932 | 10/2019 |
| CN | 110648981 | 1/2020 |
| CN | 110718593 | 1/2020 |
| CN | 110867414 | 3/2020 |
| WO | WO 2015111922 | 7/2015 |

* cited by examiner

THREE-DIMENTIONAL PACKAGING METHOD AND PACKAGE STRUCTURE OF PHOTONIC-ELECTRONIC CHIP

CROSS-REFERENCE TO RELATED APPLICATION

This application claims priority under 35 U.S.C. § 119 from Chinese Application CN 202110480406.4, filed on Apr. 30, 2021, the entire content of which is incorporated herein by reference.

TECHNICAL FIELD

The present disclosure relates to a package structure of a photonic chip and an electronic chip and a packaging method thereof, and specifically to a three-dimensional packaging method and a three-dimensional package structure of a photonic chip and an electronic chip.

BACKGROUND

Neuromorphic calculation is a method that approximating the operation of the brain in the field of electronics. A prominent method of neuromorphic calculation is artificial neural network (ANN), which is a set of artificial neurons, and the artificial neurons are connected to each other in a specific way, processing information in a way similar to the brain functions. Artificial neural networks are widely used in artificial intelligence processing tasks, and these networks perform complex mathematical operations using multiple layers of interconnected artificial neurons.

In order to speed up the computing tasks of artificial neural networks, various efforts have been made to design and implement specific electronic computing systems. In order to perform artificial intelligence tasks in various applications with high speed and low power consumption, photonic computing has been regarded as an alternative for a long time. The spectrum covers a wide range of wavelengths, so many photons with different wavelengths can be multiplexed and modulated simultaneously without interfering with each other's optical signals. Information traveling at the speed of light can bring the smallest time delay. In the past few decades, optical communication has achieved great success, but computing with photons is still challenging, especially at the scale and performance level comparable to the most advanced electronic processors. Although there are still many technical bottlenecks in the realization of all-photonic computing, it still has great potential to use photonic-electronic hybrid system to achieve computational acceleration in specific fields. For example, linear optical elements can calculate convolution, Fourier transform, random projection and many other operations at close to the speed of light, as these operations can be by-products of light interacting with matter or light propagation. These operations are the basic building blocks of ANN architecture, driving most of modern vision computation algorithms.

The modulator and detector in the photonic chip must cooperate with external driver, transimpedance amplifiers, etc. How to skillfully design the package structure to form an effective signal interconnection between the photonic chip and the electronic chip has become a major concern in the industry. At present, there are three main ways to package photonic chips and electronic chips: 1) monolithic integration, 2) two-dimensional packaging and 3) three-dimensional packaging. Monolithic integration is the simultaneous processing of optical devices and electric devices on the same wafer platform. The final chip contains both photonic chips and electronic chips, and the signals are directly interconnected through the metal inside the chip. However, because the current technique of silicon photonic chip lags far behind that of electronic chip, in order to achieve monolithic integration, compromises must be made, resulting in the performance of electric devices and optical devices not reaching the optimal level. Two-dimensional packaging is to place the photonic chip and the electronic chip side by side on the substrate, but it will lead to a limited number of interconnection lines between the photonic chip and the electronic chip (the interconnection lines can only exist on the adjacent side of the photonic chip and the electronic chip). Therefore, this scheme is not suitable for high IO number application scenarios, and at the same time, this scheme cannot achieve a compact package structure with small volume.

Compared with the two-dimensional package, the three-dimensional package (i.e. the photonic chip and the electronic chip are stacked on the substrate) can minimize the package size. In the three-dimensional packaging of photonic chips and electronic chips, in order to avoid the warpage caused by thinning the photonic chips, resulting in the misalignment or failure of the connection points between the photonic chips and the electronic chips, or in order to make the packaging of the photonic chips and the electronic chips have high strength, it is usually necessary to form a molding packaging layer on the surface of the photonic chips. However, the photonic chip has an optical coupling interface for inputting light. Molding packaging directly on the surface of the photonic chip will lead to the damage of the optical coupling interface, which will greatly increase the insertion loss of the optical coupling interface and affect the actual use of the photonic chip.

SUMMARY OF THE INVENTION

In view of the above problems, the present disclosure intends to provide a three-dimensional packaging method and package structure of a photonic-electronic chip, which can achieve the protection of the optical coupling interface on the photonic chip while fixing the photonic chip with injection molding materials to improve the packaging strength and avoid the warpage of the photonic chip.

The first aspect of the present disclosure provides a three-dimensional packaging method of a photonic-electronic chip, comprising: fixing an electronic chip on a first area of a first surface of a photonic chip; fixing a dummy chip on a second area of the first surface of the photonic chip, wherein the photonic chip is provided with an optical coupling interface at the second area, and the dummy chip has a cavity with a single-sided opening, and the opening of the cavity faces and covers the optical coupling interface; forming an injection molding material layer on the photonic chip on which the electronic chip and the dummy chip are fixed, so that the injection molding material layer covers the electronic chip, the dummy chip and the exposed areas of the first surfaces of the photonic chip; thinning the injection molding material layer, the electronic chip and the dummy chip, so that the cavity of the dummy chip is connected up and down; and fixing a second surface of the photonic chip to a package substrate.

In some embodiments, the photonic chip has an electric channel for electrically connecting the electronic chip to the package substrate, and the electric channel is connected to a first metal bump on the first surface of the photonic chip; the fixing the electronic chip on the first area of the first surface of the photonic chip comprises: flip-chipping the electronic chip to the first area of the first surface of the photonic chip, and a pin of the electronic chip is bonded with the first metal bump; the dummy chip has a dummy chip metal bump on a side with the opening; and the fixing of the dummy chip on the second area of the first surface of the photonic chip comprises: bonding the dummy chip metal bump with second metal bump on the photonic chip.

In some embodiments, the electric channel in the photonic chip is a conductive via, and the conductive via is connected to an electric connection point on the package substrate by a third metal bump on the second surface of the photonic chip after the second surface of the photonic chip is fixed on the package substrate.

In some embodiments, before fixing the electronic chip on the first area of the first surface of the photonic chip, the method further comprises: forming a metal blind via in the photonic chip, wherein the metal blind via cuts through the first surface of the photonic chip, and forming the first metal bump at the metal blind via on the first surface of the photonic chip; after forming the injection molding material layer on the photonic chip, and before thinning the injection molding material layer and the dummy chip, the method further comprises: thinning the photonic chip from the second surface of the photonic chip so that the metal blind via cuts through the second surface of the photonic chip to form the conductive via, and the third metal bump is formed at the conductive via on the second surface of the photonic chip; and the fixing of the second surface of the photonic chip on the package substrate comprises bonding the third metal bump on the second surface of the photonic chip with the electric connection point on the package substrate.

In some embodiments, thinning the injection molding material layer, the electronic chip and the dummy chip so that the injection molding material layer, the electronic chip and the dummy chip have the same height.

In some embodiments, the three-dimensional packaging method further comprises fixing the second surface of the photonic chip to a support member before thinning the injection molding material layer, the electronic chip and the dummy chip; and separating the second surface of the photonic chip from the support member before fixing the second surface of the photonic chip on the package substrate.

In some embodiments, the three-dimensional packaging method further comprises passing a fiber array through the cavity of the dummy chip and coupling the fiber array to the optical coupling interface by using optical coupling adhesive.

The second aspect of the present disclosure provides a three-dimensional package structure of a photonic-electronic chip, comprising a package substrate and a photonic chip, wherein a second surface of the photonic chip is fixed on the package substrate; an electronic chip fixed on a first area of a first surface of the photonic chip; a dummy chip fixed on a second area of the first surface of the photonic chip, wherein the photonic chip is provided with an optical coupling interface at the second area, and the dummy chip has a cavity with upper and lower openings connected up and down, and the lower opening of the cavity faces and covers the optical coupling interface; and an injection molding material layer on the first surface of the photonic chip, surrounding the electronic chip and the dummy chip, and the cavity is not filled and covered by the injection molding material layer.

In some embodiments, the photonic chip has an electric channel for electrically connecting the electronic chip to the package substrate, and the electric channel is connected to a first metal bump on the first surface of the photonic chip; the electronic chip is flip-chipped on the first area of the first surface of the photonic chip, and a pin of the electronic chip is bonded with the first metal bump; the dummy chip metal bump has a dummy chip metal bump on a side with the opening; and the dummy chip metal bump is bonded with second metal bump on the photonic chip.

In some embodiments, the electric channel in the photonic chip is a conductive via, and the conductive via cuts through the photonic chip; and the conductive via is connected to an electric connection point on the package substrate by a third metal bump on the second surface of the photonic chip.

In some embodiments, the injection molding material layer, the dummy chip and the electronic chip have the same height.

In some embodiments, the optical coupling interface is an optical coupling interface of a grating coupler.

In some embodiments, the three-dimensional package structure further comprises a fiber array, which passes through the cavity of the dummy chip and is coupled to the optical coupling interface by optical coupling adhesive.

The third aspect of the present disclosure provides another three-dimensional packaging method of a photonic-electronic chip, comprising: fixing an electronic chip on a first area of a first surface of the photonic-electronic chip; forming an optical coupling adhesive layer on a second area of the first surface of the photonic chip, wherein the photonic chip is provided with an optical coupling interface at the second area, and the optical coupling adhesive layer covers the optical coupling interface; forming an injection molding material layer on the first surface of the photonic chip, wherein the injection molding material layer surrounds the electronic chip and the optical coupling adhesive layer, wherein the part of the injection molding material layer above the optical coupling interface has a through hole with upper and lower openings connected up and down, and the coverage area of the lower opening of the through hole covers the optical coupling interface; fixing the second surface of the photonic chip on the package substrate.

In some embodiments, the three-dimensional packaging method further comprises fixing a dummy chip on the optical coupling adhesive layer; wherein forming an injection molding material layer on the first surface of the photonic chip comprises: forming the injection molding material layer on the photonic chip on which the electronic chip and the dummy chip are fixed, so that the injection molding material layer covers the electronic chip, the dummy chip and the exposed areas of the first surface of the photonic chip; and thinning the injection molding material layer so that the part of the injection molding material layer on the dummy chip is removed, and the method further comprises etching the part of the dummy chip above the optical coupling interface, so that the dummy chip is completely etched out, or the dummy chip is partially etched to form a cavity with upper and lower openings connected up and down, and the coverage area of the lower opening of the cavity covers the optical coupling interface.

In some embodiments, forming the injection molding material layer on the first surface of the photonic chip comprises: forming the injection molding material layer on the photonic chip on which the electronic chip is fixed and the optical coupling adhesive layer is formed, so that the injection molding material covers the electronic chip, the optical coupling adhesive layer and the exposed areas of the first surface of the photonic chip; etching the part of the injection molding material layer above the optical coupling interface, so that the part of the injection molding material layer above the optical coupling interface forms the through hole with upper and lower openings connected up and down, and the coverage area of the lower opening of the through hole covers the optical coupling interface.

In some embodiments, the three-dimensional packaging method further comprises: fixing an optical waveguide module on the optical coupling adhesive layer, wherein the optical waveguide module is used for coupling light from the upper surface of the optical waveguide module to the optical coupling interface corresponding to the lower surface thereof; wherein forming an injection molding material layer on the first surface of the photonic chip comprises: forming an injection molding material layer on the photonic chip on which the electronic chip and the optical waveguide module are fixed, so that the injection molding material layer covers the electronic chip, the optical waveguide module and the exposed areas of the first surface of the photonic chip; and thinning the injection molding material layer so that the part of the injection molding material layer located on the optical waveguide module is removed.

In some embodiments, the photonic chip has an electric channel for electrically connecting the electronic chip to the package substrate, and the electric channel is connected to the first metal bump on the first surface of the photonic chip; the fixing the electronic chip on the first area of the first surface of the photonic chip comprises: flip-chipping the electronic chip to the first area of the first surface of the photonic chip, and a pin of the electronic chip is bonded with the first metal bump.

In some embodiments, the electric channel in the photonic chip is a conductive via, and the conductive via is connected to an electric connection point on the package substrate by a third metal bump on the second surface of the photonic chip after the second surface of the photonic chip is fixed on the package substrate.

In some embodiments, before fixing the electronic chip on the first area of the first surface of the photonic chip, the method further comprises: forming a metal blind via in the photonic chip, the metal blind via cuts through the first surface of the photonic chip, and forming the first metal bump at the metal blind via on the first surface of the photonic chip; after forming the injection molding material layer on the photonic chip, the method further comprises: thinning the photonic chip from the second surface of the photonic chip so that the metal blind via cuts through the second surface of the photonic chip to form the conductive via, and forming a third metal bump at the conductive via on the second surface of the photonic chip; and fixing the second surface of the photonic chip on the package substrate comprises bonding the third metal bumps on the second surface of the photonic chip with the electric connection point on the package substrate.

In some embodiments, the three-dimensional packaging method further comprises thinning the dummy chip and the electronic chip so that the injection molding material layer, the dummy chip and the electronic chip have the same height.

In some embodiments, the three-dimensional packaging method further comprises thinning the injection molding material layer and the electronic chip so that the injection molding material layer and the electronic chip have the same height.

In some embodiments, the three-dimensional packaging method further comprises thinning the optical waveguide module and the electronic chip so that the injection molding material layer, the optical waveguide module and the electronic chip have the same height.

In some embodiments, the three-dimensional packaging method further comprises fixing the second surface of the photonic chip to a support member before thinning the injection molding material layer; and separating the second surface of the photonic chip from the support member before fixing the second surface of the photonic chip on the package substrate.

In some embodiments, the three-dimensional packaging method further comprises passing a fiber array through the cavity of the dummy chip and coupling the fiber array to the optical coupling interface using optical coupling adhesive.

In some embodiments, the three-dimensional packaging method further comprises passing the fiber array through the through hole of the injection molding material layer and coupling the fiber array to the optical coupling interface using optical coupling glue.

In some embodiments, the three-dimensional packaging method further comprises coupling the fiber array or a laser to the upper surface of the optical waveguide module using optical coupling adhesive.

The fourth aspect of the present disclosure provides another three-dimensional package structure of a photonic-electronic chip, comprising: a package substrate and a photonic-electronic chip, wherein the second surface of the photonic chip is fixed on the package substrate; an electronic chip fixed on the first area of the first surface of the photonic chip; an optical coupling adhesive layer fixed on the second area of the first surface of the photonic chip, wherein the photonic chip is provided with an optical coupling interface at the second area; and an injection molding material layer on the first surface of the photonic chip, surrounding the electronic chip and the optical coupling adhesive layer, wherein the part of the injection molding material layer above the optical coupling interface has a through hole with upper and lower openings connected up and down, and the coverage area of the lower opening of the through hole covers the optical coupling interface.

In some embodiments, the three-dimensional package structure further comprises: a dummy chip fixed on the optical coupling adhesive layer and located inside the through hole and surrounded by the injection molding material layer, and the dummy chip has a cavity with upper and lower openings connected up and down at the part above the optical coupling interface, the coverage area of the lower opening of the cavity covers the optical coupling interface, and the cavity is not filled and covered by the injection molding material layer.

In some embodiments, the three-dimensional packaging structure further comprises: an optical waveguide module fixed on the optical coupling adhesive layer and located inside the through hole and surrounded by the injection molding material layer, used for coupling light from the upper surface of the optical waveguide module to the optical coupling interface corresponding to the lower surface thereof.

In some embodiments, the photonic chip has an electric channel for electrically connecting the electronic chip to the package substrate, and the electric channel is connected to the first metal bump on the first surface of the photonic chip; the electronic chip is flip-chipped to the first area of the first surface of the photonic chip, and a pin of the electronic chip is bonded with the first metal bump.

In some embodiments, the electric channel in the photonic chip is a conductive via, and the conductive via cuts through the photonic chip; and the conductive via is connected to an electric connection point on the package substrate by a third metal bump on the second surface of the photonic chip.

In some embodiments, the injection molding material layer and the electronic chip have the same height.

In some embodiments, the injection molding material layer, the dummy chip and the electronic chip have the same height.

In some embodiments, the injection molding material layer, the optical waveguide module and the electronic chip have the same height.

In some embodiments, the optical coupling interface is an optical coupling interface of a grating coupler.

In some embodiments, the three-dimensional package structure further comprises a fiber array, which passes through the through hole of the injection molding material layer and is coupled to the optical coupling interface by optical coupling adhesive.

In some embodiments, the three-dimensional package structure further comprises a fiber array, which passes through the cavity of the dummy chip and is coupled to the optical coupling interface by optical coupling adhesive.

In some embodiments, the three-dimensional package structure further comprises a laser or a fiber array which is coupled to the upper surface of the optical waveguide module by optical coupling adhesive.

DESCRIPTION OF THE EMBODIMENTS

Figure 1:
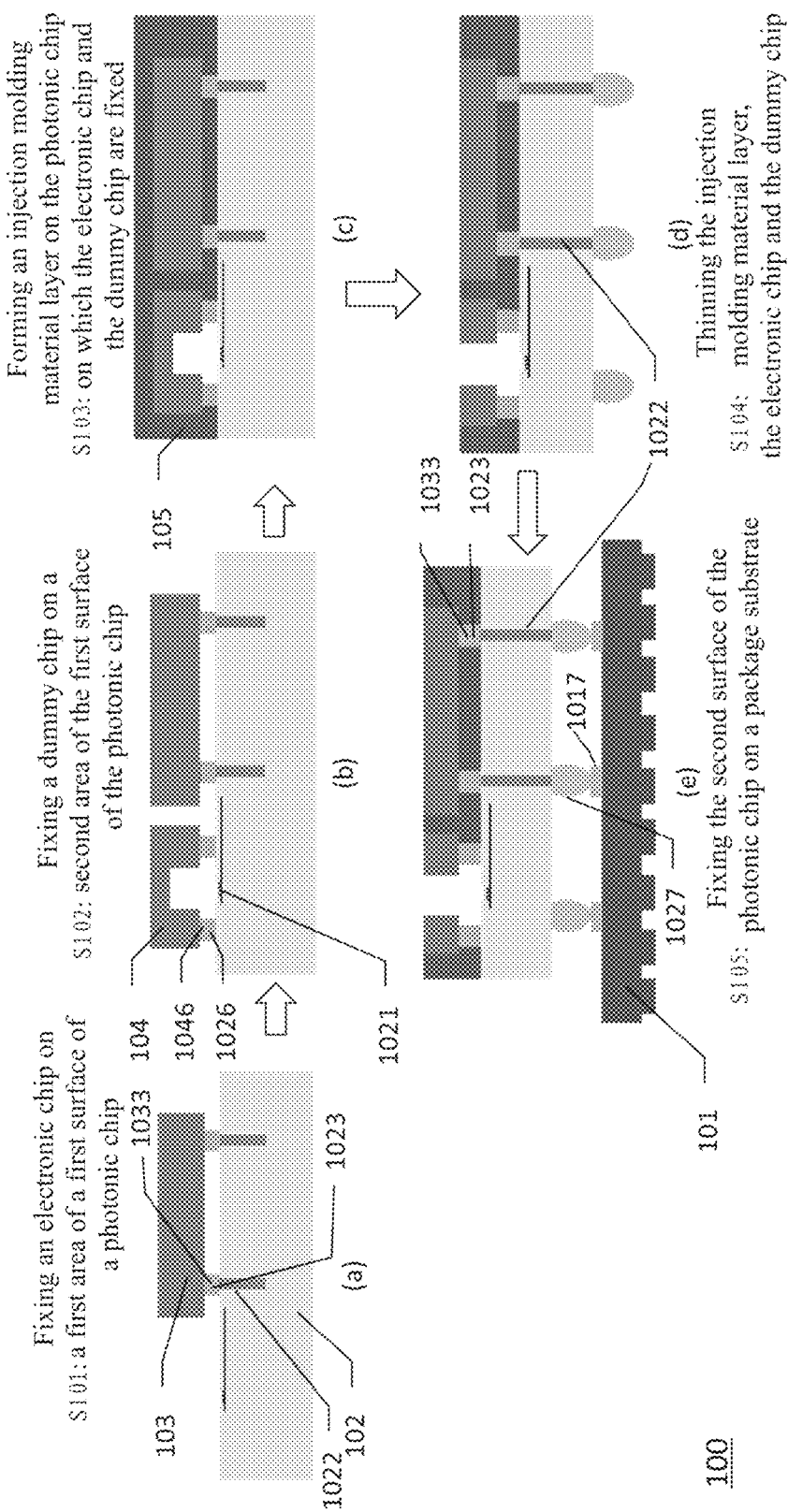
FIG. 1 shows an example process flowchart of a three-dimensional packaging method of a photonic-electronic chip according to an embodiment of the present disclosure.

Embodiments of the present disclosure will be described in more detail below with reference to the accompanying drawings. Although some embodiments of the present disclosure are shown in the drawings, it should be understood that the present disclosure should not be construed as limited to the embodiments set forth herein. Rather, these embodiments are provided for a more thorough and complete understanding of the present disclosure. It should be understood that the drawings and embodiments of the present disclosure are only for exemplary purpose and are not intended to limit the scope of the present disclosure.

It should be understood that the various steps described in the embodiments of the method of the present disclosure can be performed in different order and/or in parallel. In addition, embodiments of the method may include other steps and/or omit some steps.

The embodiments of the present disclosure provide a three-dimensional packaging method of a photonic-electronic chip. FIG. 1 shows a process flowchart of a three-dimensional packaging method 100 of the photonic-electronic chip according to an embodiment of the present disclosure. The term "photonic-electronic chip" in this disclosure represents "photonic chip and electronic chip".

As shown in FIG. 1, the three-dimensional packaging method 100 of a photonic-electronic chip 103 according to an embodiment of the present disclosure comprises: firstly fixing an electronic chip 103 (also referred to as an electronic integrated circuit (EIC)) on a first area of a first surface of a photonic chip 102 (also referred to as a photonic integrated circuit (PIC)) (S101), and then fixing a dummy chip 104 on a second area of the first surface of the photonic chip 102 (S102). In this disclosure, the photonic chip 102 is an integrated circuit that integrates photonic components, such as a silicon photonic integrated circuit that integrates photonic components such as grating coupler, optical waveguide array, Mach Zehnder interferometer and/or photodetector, etc. The photonic chip 102 can be used for signal transmission and/or photon calculation, such as for calculation in artificial intelligence. The electronic chip 103 refers to an electronic integrated circuit, such as a silicon electronic integrated circuit that integrates electronic components such as a processor and/or a memory, etc. The dummy chip 104 is a wafer on which no photonic components and electronic components are integrated or provided, such as dummy silicon wafer.

In the example shown in FIG. 1, the electronic chip 103 and the dummy chip 104 are arranged in different areas of the first surface (upper surface) of the photonic chip 102 in side-by-side manner, and the electronic chip 103 and the dummy chip 104 are spaced apart a certain distance.

It should be understood that the example shown in FIG. 1 is only schematic. According to the embodiments of the present disclosure, the electronic chip 103 and the dummy chip 104 may be arranged on the surface of the photonic chip 102 in any suitable manner. For example, depending on the arrangement of the optical devices in the photonic chip 102, the electronic chip 103 can be arranged in the temperature-insensitive area of the optical devices to reduce the influence of heat dissipation of the electronic chip 103 on the performance of the optical devices. For example, if micro-ring resonator is arranged in the photonic chip 102, it should be avoided to arrange the electronic chip 103 in the area of the photonic chip 102 where the micro-ring resonator is located so as to avoid the damage of the micro-ring resonator caused by the heat dissipation of the electronic chip 103, because micro-ring resonator is very sensitive to temperature fluctuations. On the contrary, since the dummy chip 104 is a dummy silicon wafer without integrated by any devices, it does not have the problem of heat dissipation similar to that of the electronic chip 103, so the dummy chip 104 can be arranged in the area where the temperature-sensitive optical devices are located. In addition, depending on the size of the photonic chip 102 or the size of the entire package, the electronic chip 103 and the dummy chip 104 can be arranged side-by-side and adjacent closely to each other, so as to adapt to the size of the entire package or make the size of the entire package more compact. The arrangement of the electronic chip 103 and the dummy chip 104 on the photonic chip 102 is not limited to the above manners.

As shown in FIG. 1, the photonic chip 102 is provided with an optical coupling interface 1021 at the second area where the dummy chip 104 is fixed. The optical coupling interface 1021 is used to couple light emitted by an external light source into the photonic chip 102 for use by various optical devices in the photonic chip 102. For example, the optical coupling interface 1021 according to the embodiment of the present disclosure may be a coupling interface of a grating coupler, which may be, for example, a loopback grating coupler with multiple channels (for example, 32 or 64 or more). The light provided by the external light source can be input to the optical coupling interface 1021 of the grating coupler through fiber array for use by the grating coupler and subsequent optical devices.

In order to protect the optical coupling interface 1021, the dummy chip 104 according to the embodiment of the present disclosure has a cavity with a single-sided opening, and the opening of the cavity faces and covers the optical coupling interface 1021. The dummy chip 104 and its cavity can form a closed protective space for the optical coupling interface 1021. In one example, the cross-section of the dummy chip 104 and the cavity may have a rectangular shape as shown in FIG. 1(b), while the dummy chip 104 containing the cavity may have a shape similar to "回" when viewed from bottom to top. It should be understood that the shape of "回" as described above is only an example of the shape of the dummy chip 104 and its cavity, and the shape of the dummy chip and its cavity is not limited to the above shape. For example, according to actual needs, the dummy chip can have various shapes, including but not limited to cube, cuboid, cylinder, other polygonal cylinder structures or irregular structures, and the cavity in the dummy chip can also have various shapes, including but not limited to cube, cuboid, cylinder, other polygonal cylinder structures or irregular structures, so as to adapt to the position and shape of the optical coupling interface, thereby forming a closed protection space for the optical coupling interface.

Furthermore, it should be understood that although an example of firstly fixing an electronic chip 103 on a first area of a first surface of a photonic chip 102, and then fixing a dummy chip 104 on a second area of the first surface of the photonic chip 102 is shown in FIG. 1, this is only exemplary. According to the actual needs, the order of fixing the electronic chip 103 and the dummy chip 104 can be arbitrary. For example, the dummy chip 104 can be fixed before the electronic chip 103 is fixed, or the electronic chip 103 and the dummy chip 104 can be fixed simultaneously in the same process. Even if the step of "fixing the electronic chip" is described first and then the step of "fixing the dummy chip" is described in the specification and claims of the present disclosure, it does not mean that the two steps must have a sequential relationship.

Referring to FIG. 1 again, after the electronic chip 103 and the dummy chip 104 are fixed on the first surface of the photonic chip 102 (S101, S102), the three-dimensional packaging method 100 of the photonic-electronic chip 103 according to the embodiment of the present disclosure further comprises forming an injection molding material layer 105 on the photonic chip 102 on which the electronic chip 103 and the dummy chip 104 are fixed (S103), so that the injection molding material layer 105 covers the electronic chip 103, the dummy chip 104 and the exposed areas of the first surface of the photonic chip 102. The injection molding material can be, for example, epoxy resin, which covers the above-mentioned chips in a molten state and forms an injection molding material layer after curing. After the injection molding material layer 105 is formed on the photonic chip 102 on which the electronic chip 103 and the dummy chip 104 are fixed, the electronic chip 103 and the dummy chip 104 are firmly fixed on the respective positions of the photonic chip 102, so that a highly reliable package structure can be formed, making the packaged product stronger and less likely to be damaged. Also, in the process of packaging the photonic-electronic chip, it may be necessary to thin the photonic chip 102. However, the traditional thinning process tends to warp the photonic chip 102, which causes the misalignment or even failure of the connection point between the photonic chip 102 and the electronic chip 103. Injection molding to the chip can solve the problem of warping.

As shown in FIG. 1, after forming the injection molding material layer 105 on the photonic chip 102 on which the electronic chip 103 and the dummy chip 104 are fixed (S103) as described above, the cavity of the dummy chip 104 forms a closed space isolated from the injection molding material layer 105 for the optical coupling interface 1021. Due to the presence of the cavity of the dummy chip 104, the injection molding material cannot enter the cavity in the process of injection molding, thus preventing the injection molding material from covering the optical coupling interface 1021, and in this way, the optical coupling interface 1021 is isolated from the injection molding material, and the optical coupling interface 1021 is protected.

After forming the injection molding material layer 105 on the photonic chip 102 on which the electronic chip 103 and the dummy chip 104 are fixed (S103), the three-dimensional packaging method 100 of the photonic-electronic chip 103 according to the embodiment of the present disclosure further comprises thinning the injection molding material layer 105, the electronic chip 103 and the dummy chip 104 (S104), so that the part of the injection molding material layer 105 located on the dummy chip 104 and the electronic chip 103 is removed, and the cavity of the dummy chip 104 can connect up and down. Through the above thinning process, the cavity of the dummy chip 104 can be through up and down, thereby re-exposing the optical coupling interface 1021, which facilitates subsequently input light of the external light source into the photonic chip 102 through the optical coupling interface 1021.

The above-mentioned thinning process can also make the injection molding material layer 105, the dummy chip 104 and the electronic chip 103 have the same height. That is, the upper surfaces of the injection molding material layer 105, the dummy chip 104 and the electronic chip 103 are at the same height. Such packaged chip makes the subsequent process more convenient, for example, it is more convenient to apply housing to the package structure later. The above-mentioned thinning can be carried out by grinding methods such as mechanical grinding. The photonic chip 102 covered with the injection molding material layer 105 is put into a grinding machine for grinding to achieve the required thickness and surface roughness, and the required rewiring and solder bumping process of the surface is continued.

In addition, according to the embodiment of the present disclosure, before thinning the injection molding material layer 105 and the dummy chip 104 (S104), the method 100 may further comprise: fixing a second surface of the photonic chip 102 to a support member. By fixing the photonic chip 102 to the support member, thinning the injection molding material layer 105 and the dummy chip 104 is facilitated. For example, the lower surface of the photonic chip 102 can be fixed to the support member (e.g., a carrier wafer) by an adhesive, and then the injection molding material layer 105 and the dummy chip 104 can be thinned by mechanical grinding. Thereafter, before fixing the second surface of the photonic chip 102 on a package substrate 101 (S105), separating the second surface of the photonic chip 102 from the support member.

After thinning the injection molding material layer 105, the electronic chip 103 and the dummy chip 104 (S104), the three-dimensional packaging method 100 of the photonic-electronic chip 103 according to the embodiment of the present disclosure further comprises: fixing the second surface of the photonic chip 102 on the package substrate 101 (S105). In some embodiments, the package substrate 101 has a Land Grid Array (LGA) structure. However, the package substrate 101 according to the embodiment of the present disclosure is not limited to the LGA structure. For example, it may also have various other structures, including but not limited to Pin Grid Array (PGA), Ball Grid Array (BGA), and the like.

Figure 2:
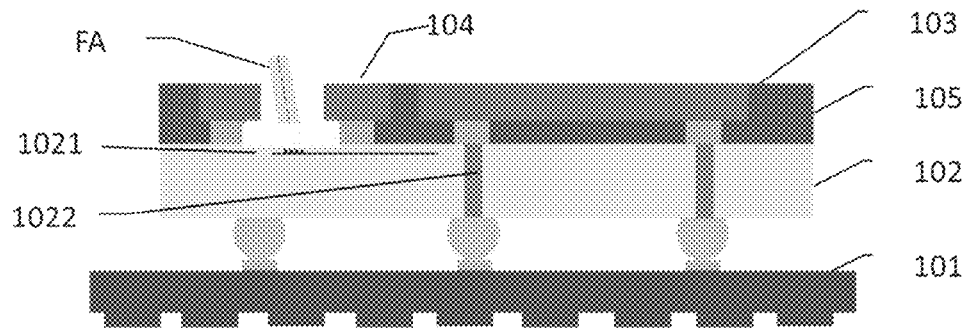
FIG. 2 shows a process flowchart of another example step included in a three-dimensional packaging method of a photonic-electronic chip according to an embodiment of the present disclosure.

According to the embodiment of the present disclosure, after the step S105 shown in FIG. 1(*e*) is completed, as shown in FIG. 2, the three-dimensional packaging method 100 may further comprise: passing a fiber array FA through the cavity of the dummy chip 104 and coupling to the optical coupling interface 1021 using an optical coupling adhesive (S106). In FIG. 2, there is an optical coupling adhesive between the optical coupling interface 1021 and the fiber array FA for fixing the fiber array FA on the optical coupling interface 1021. According to some embodiments, the fiber array may be the obliquely coupled to the optical coupling interface 1021 using the optical coupling adhesive. For example, the fiber array may be coupled to the interface of the grating coupler at an angle of 45° with respect to the first surface of the photonic chip 102, and the other end of the fiber array may be connected to an external light source to provide an optical signal input for the photonic chip 102.

Referring to FIG. 1 again, as shown in step S105, the photonic chip 102 further has at least one electric channel 1022 for electrically connecting the electronic chip 103 to the package substrate 101, and the electric channel 1022 is connected to a first metal bump 1023 on the first surface of the photonic chip 102. It should be understood that although FIG. 1 shows that there are two electric channels in the photonic chip 102, this is only exemplary. Depending on actual applications, more electric channels can be formed in the photonic chip 102, which are used to electrically interconnect the electronic chip 103 with the package substrate 101. In the example shown in FIG. 1, the electric channel 1022 is a conductive via, that is, a via that is formed in the photonic chip 102 and a conductive material, such as metal, is injected, so that both ends of the conductive via are electrically connected. However, the electric channel 1022 of the present disclosure is not limited to the conductive via, and may be any form of electric channel that enables both ends to be electrically connected.

In some embodiments, fixing the electronic chip 103 on the first area of the first surface of the photonic chip 102 (S101) comprises: flip-chipping the electronic chip 103 to the first area of the first surface of the photonic chip 102, and the pin 1033 of the electronic chip 103 is bonded with the first metal bump 1023 connected to the electric channel 1022, as shown in FIG. 1(*a*) and FIG. 1(*e*) (in the Figures, the pin 1033 and the first metal bump 1023 are bonded together). The example of FIG. 1 shows that all the pins of the electronic chip 103 are connected with the first metal bumps 1023 at the electric channels 1022, but this is only exemplary. In other embodiments, not all pins in the electronic chip are to be interconnected with the package substrate through electric channels. For example, the pins in the electronic chip that are dedicated to interconnect with the photonic chip can be directly interconnected with the photonic chip, instead of having to be connected to the package substrate through electric channel.

In addition, in some embodiments, the dummy chip 104 also has a metal bump (i.e. a dummy chip metal bump 1046) on the side with an opening, and fixing the dummy chip 104 on the second area of the first surface of the photonic chip 102 comprises: bonding the dummy chip metal bump 1046 with second metal bump 1026 on the photonic chip 102, as shown in FIG. 1(*b*) (in the Figure, the dummy chip metal bump 1046 and the second metal bump are bonded together). It should be understood that although the dummy chip 104 can be connected with the photonic chip 102 by the metal bump, since the dummy chip 104 is a dummy chip 104 that does not contain any optical components or electric components, it is not necessary to interconnect the dummy chip 104 with the package substrate 101 through the electric channel 1022. In addition, the manner of fixing the dummy chip 104 on the photonic chip 102 is not limited to bonding with the metal bump, and any other suitable manner can be used, such as fixing the dummy chip 104 on the photonic chip 102 with an adhesive.

According to some embodiments, the electric channel 1022 in the photonic chip 102 as shown in FIG. 1 is a conductive via, which is connected to the electric connection point 1017 on the package substrate 101 by a third metal bump 1027 on the second surface of the photonic chip 102 after the second surface of the photonic chip 102 is fixed on the package substrate 101, as shown in Fig. (e).

When the photonic chip 102 is a silicon chip, the conductive via in the photonic chip 102 is also called "Through Silicon Via" (TSV). TSV is a high-density packaging technique, which is gradually replacing the current mature wire-bond technique and is considered as the fourth-generation packaging technique. TSV technique achieves vertical electric interconnection of Through Silicon Via by filling conductive substances such as copper, tungsten and polysilicon. Through Silicon Via technique can reduce interconnection length, signal delay, capacitance/inductance through vertical interconnection, achieve low power consumption and high-speed communication between chips, increase broadband and achieve miniaturization of device integration. The TSV process may comprise techniques such as deep silicon etching to form micropores or blind vias, deposition of insulating layer/barrier layer/seed layer, deep via filling, chemical mechanical polishing, thinning, and redistribution lead preparation, etc.

Figure 3:
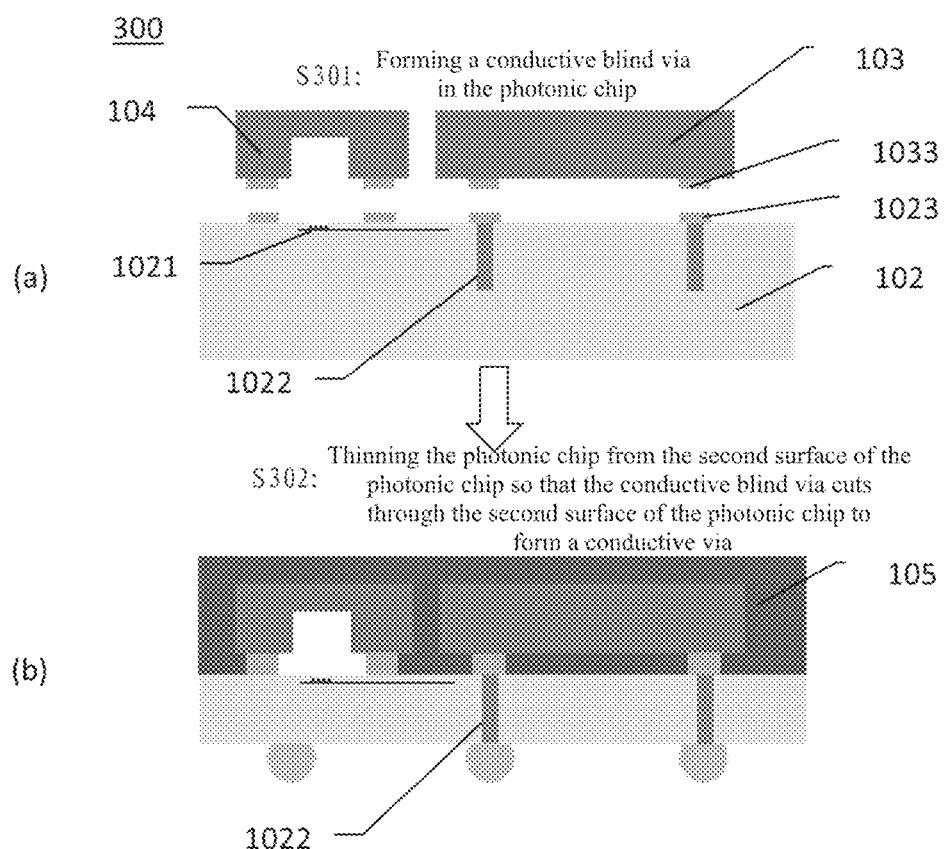
FIG. 3 shows a process flowchart of a method of forming a conductive via in a photonic chip according to an embodiment of the present disclosure.

FIG. 3 shows a process flowchart of a method 300 of forming a conductive via in a photonic chip according to an embodiment of the present disclosure.

According to an embodiment of the present disclosure, the method 300 of forming the conductive via 1022 in the photonic chip comprises: forming a metal blind via in the photonic chip before fixing the electronic chip on the first area of the first surface of the photonic chip as shown in FIG. 1 (S301). In some embodiments, the metal blind via cuts through the first surface of the photonic chip, and the first metal bump 1023 as described with respect to FIG. 1 is formed at the metal blind via on the first surface of the photonic chip. The first metal bump is, for example, a pad or a solder ball. Methods of forming blind via in a photonic chip include, but are not limited to, laser etching, deep reactive ion etching, etc. After the blind via is formed, conductive materials (such as metal) are filled by processes such as deep via filling.

As shown in FIG. 3. According to an embodiment of the principles of the present disclosure, the method 300 of forming a conductive via in the photonic chip further comprises: after forming the injection molding material layer on the photonic chip as shown in FIG. 1, thinning the photonic chip from the second surface of the photonic chip so that the metal blind via cuts through the second surface of the photonic chip to form the conductive via (S302). Also, after the conductive via is formed, a third metal bump 1027 may be formed at the conductive via on the second surface of the photonic chip. The thinning of the photonic chip can be carried out, for example, by mechanical grinding. The photonic chip on which the injection molding material layer is formed is put into a grinding machine, and then ground to achieve the required thickness and surface roughness, and the blind via in the photonic chip are through to form a via. In this disclosure, due to the protection of the injection molding material layer, the warpage of the photonic chip can be avoided when thinning the photonic chip. In an embodiment of the present disclosure, the conductive via 1022 is formed after the closed end of the conductive blind via is removed, both of which point to the same part in the product, so the same reference numeral 1022 is used to denote the conductive blind via, and when describing "conductive via", the "conductive via" may represent "conductive blind via" according to the stage of the process flow.

It should be noted that the conductive material in the conductive via according to an embodiment of the present disclosure can be completely filled or incompletely filled, as long as the conductive via can be formed to meet the required conductivity. For example, incomplete filling may only form a conductive material layer on the inner wall of the via. The conductive materials used for complete or incomplete filling include, but are not limited to, polysilicon, copper, tungsten, polymer conductors, etc., and the methods of filling the via with conductive material layers include, but are not limited to, electroplating, chemical vapor deposition, polymer coating, etc.

In some embodiments, in the case that a plurality of conductive vias are contained in the photonic chip and the third metal bump is formed, fixing the second surface of the photonic chip on the package substrate (S105) comprises: bonding the third metal bump 1027 on the second surface of the photonic chip with the electric connection point 1017 on the package substrate.

The three-dimensional packaging method of a photonic-electronic chip provided by the above embodiment of the present disclosure, the injection molding material layer is formed in the package, so that the package structure is more stable and warpage of the photonic chip caused by thinning can be avoided; meanwhile, the optical coupling interface in the photonic chip is not damaged by the injection molding material layer due to the introduction of the dummy chip, and the optical coupling interface is protected.

Figure 4:
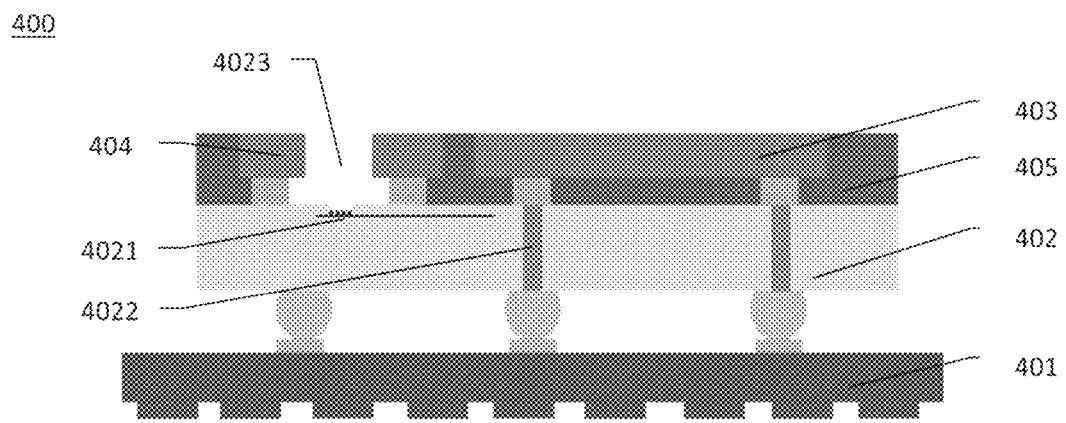
FIG. 4 shows a cross-sectional view of an example of a three-dimensional package structure of a photonic-electronic chip according to an embodiment of the present disclosure.

A three-dimensional package structure of a photonic-electronic chip is also provided according to an embodiment of the present disclosure. FIG. 4 shows a cross-sectional view of an example of a three-dimensional package structure 400 of a photonic-electronic chip according to an embodiment of the present disclosure.

As shown in FIG. 4, a three-dimensional package structure 400 of a photonic-electronic chip according to an embodiment of the present disclosure comprises: a package substrate 401, a photonic chip 402, an electronic chip 403, a dummy chip 404, and an injection molding material layer 405.

As shown in FIG. 4, a second surface of the photonic chip 402 is fixed on the package substrate 401, the electronic chip 403 is fixed on a first area of a first surface of the photonic chip 402, and the dummy chip 404 is fixed on a second area of the first surface of the photonic chip 402. It should be understood that the first area and the second area are areas on the first surface of the photonic chip 403 that do not overlap each other. As shown in FIG. 4, the photonic chip 402 is provided with an optical coupling interface 4021 at the second area on which the dummy chip 404 is fixed, and the optical coupling interface 4021 is used for coupling light emitted by an external light source into the photonic chip 402. For example, the optical coupling interface 4021 according to an embodiment of the present disclosure may be a coupling interface of a grating coupler. The light provided by the external light source can be input to the optical coupling interface of the grating coupler through the fiber array and coupled into the photonic chip 402 through the grating coupler.

To protect the optical coupling interface 4021, the dummy chip 404 according to an embodiment of the present disclosure has a cavity 4023 with upper and lower openings connected up and down, and the lower opening of the cavity faces and covers the optical coupling interface 4021.

Figure 5:
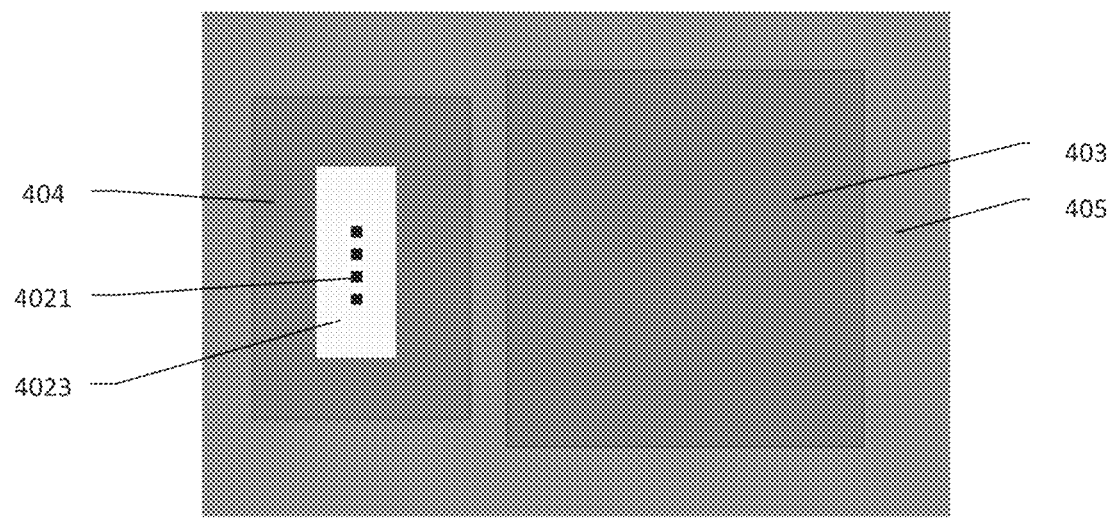
FIG. 5 shows a top view of an example of a three-dimensional package structure of a photonic-electronic chip according to an embodiment of the present disclosure.

FIG. 5 shows an example top view of the structure except the package substrate 401 in the three-dimensional package structure 400 of a photonic-electronic chip corresponding to the cross-sectional view in FIG. 4 according to an embodiment of the present disclosure, wherein the same element symbols as those in FIG. 4 represent the same elements. As shown in FIG. 5, the dummy chip 404 with a cavity has a cross-sectional shape similar to a "回" shape.

In addition, as shown in FIGS. 4 and 5, the injection molding material layer 405 is located on the first surface of the photonic chip 402 and surrounds the electronic chip 403 and the dummy chip 404. The cavity formed in the dummy chip 404 is not filled and covered by the injection molding material layer 405, so that the optical coupling interface 4021 is not covered and damaged by the injection molding material, and an optical input element (e.g. fiber array) can be coupled to the optical coupling interface 4021 through the cavity.

Referring to FIG. 4 again, the photonic chip 402 may also have at least one electric channel 4022 for electrically connecting the electronic chip 403 to the package substrate 401, and the electric channel 4022 is connected to the first metal bump on the first surface of the photonic chip 402. The electronic chip 403 may be connected to the first area of the first surface of the photonic chip 402 in a flip-chip manner.

In some embodiments, the dummy chip 404 may have a dummy chip metal bump on a side of the lower opening, and the dummy chip metal bump is bonded with second metal bump on the photonic chip 402.

According to some embodiments, the electric channel 4022 in the photonic chip 402 as shown in FIG. 4 is a conductive via, which cuts through the photonic chip 402 and is connected to an electric connection point on the package substrate 401 by a third metal bump on the second surface of the photonic chip 402.

According to some embodiments, as shown in FIG. 4, the dummy chip 404, the electronic chip 403 and the injection molding material layer 405 may have the same height.

In addition, according to some embodiments, the three-dimensional package structure of a photonic-electronic chip according to an embodiment of the present disclosure may further comprise a fiber array (see fiber array FA shown in FIG. 2), which is coupled to the optical coupling interface 4021 by passing through the cavity of the dummy chip 404. According to some embodiments, the fiber array may be obliquely coupled to the optical coupling interface 4021 using optical coupling adhesive. For example, the fiber array may be coupled to the interface of the grating coupler at an angle of 45° with respect to the first surface of the photonic chip 402, and the other end of the fiber array may be connected to an external light source to provide an optical signal input to the photonic chip.

It should be noted that the above detailed description of the three-dimensional packaging method with reference to FIGS. 1-3 is also applicable to the three-dimensional package structure of FIG. 4 and FIG. 5.

Figure 6:
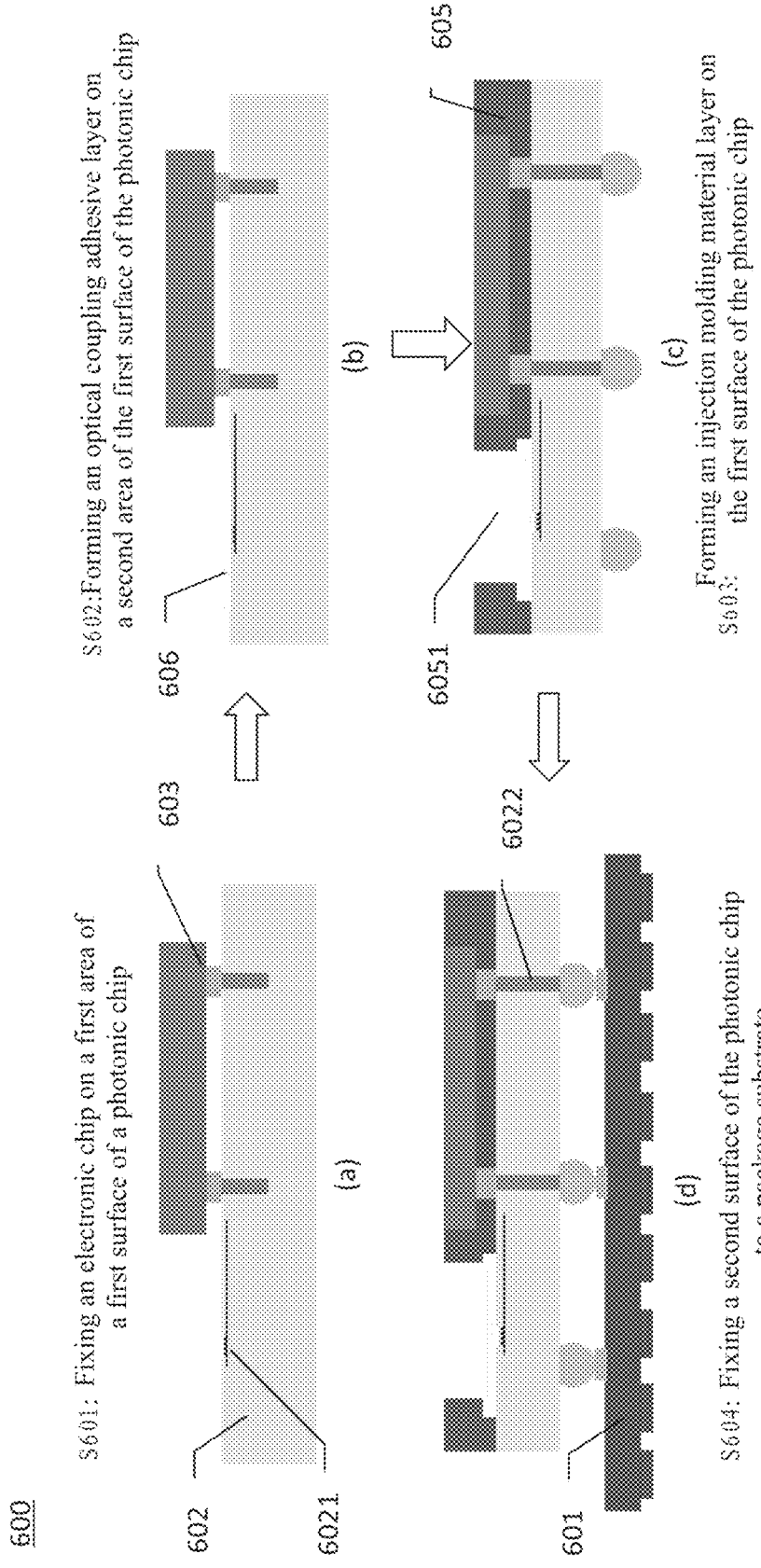
FIG. 6 shows another example process flowchart of a three-dimensional packaging method of a photonic-electronic chip according to an embodiment of the present disclosure.

FIG. 6 shows a process flowchart of a three-dimensional packaging method 600 of a photonic-electronic chip according to another embodiment of the present disclosure.

As shown in FIG. 6, the three-dimensional packaging method 600 of a photonic-electronic chip comprises: fixing an electronic chip 603 on a first area of a first surface of a photonic chip 602 (S601) and forming an optical coupling adhesive layer 606 on a second area of the first surface of the photonic chip 602 (S602). Wherein the photonic chip 602 is provided with an optical coupling interface 6021 at the second area, and the optical coupling adhesive layer 606 covers the optical coupling interface 6021.

The photonic chip 602 in this embodiment may be the photonic chip 102 as described above in conjunction with FIG. 1, and the electronic chip 603 in this embodiment may be the electronic chip 103 as described above in conjunction with FIG. 1, and the optical coupling interface 6021 in this embodiment may also be the coupling interface of the grating coupler as described above with respect to FIG. 1, which will not be repeated here.

In this embodiment, the material of the optical coupling adhesive layer 606 is any adhesive capable of optical coupling, such as ultraviolet curing adhesive. For example, forming the optical coupling adhesive layer 606 on the second area of the first surface of the photonic chip 602 (S602) may comprise: applying a ultraviolet curing adhesive in the area where the optical coupling interface 6021 is located and completely covering the optical coupling interface 6021, and then irradiating with an ultraviolet lamp with appropriate wavelength (e.g., 365 nm-400 nm) and energy until it is completely cured, thereby forming the optical coupling adhesive layer 606. During the curing process, the curing time varies with different materials, thickness of adhesive layer and ultraviolet intensity. The cured optical coupling adhesive layer 606 is a transparent adhesive layer, for example, having a light transmittance of 90%-98% or higher, so it can allow the light provided by an external light source to be input into the optical coupling interface 6021 with less loss. The cured optical coupling adhesive layer 606 can effectively protect the optical coupling interface 6021, and prevent the subsequent processing (for example, the formation and opening of the injection molding material layer as will be described below) from damaging or destroying the optical coupling interface 6021. In addition, even if the optical coupling adhesive layer 606 is inevitably damaged in the process flow, it is relatively easy to repair, for example, applying another layer of optical coupling adhesive of the same material on the surface of the damaged optical coupling adhesive layer 606. In addition, when an optical input element such as a fiber array is coupled to the optical coupling interface 6021 covered the optical coupling adhesive layer 606, it is also necessary to apply the optical coupling adhesive, so the optical coupling adhesive layer 606 can be automatically repaired when the optical input element is coupled by the optical coupling adhesive.

After forming the optical coupling adhesive layer 606 on the second area of the first surface of the photonic chip 602 (S602), the method 600 further comprises: forming an injection molding material layer 605 on a first surface of a photonic chip 602 (S603). As shown in FIG. 6(c), the injection molding material layer 605 surrounds the electronic chip 603 and the optical coupling adhesive layer 606, and the part of the injection molding material layer 605 above the optical coupling interface 6021 has a through hole 6051 with upper and lower openings connected up and down, and the lower opening of the through hole 6051 covers the optical coupling interface 6021.

After the injection molding material layer 605 with the through hole 6051 as shown in FIG. 6(c) is formed, fixing the second surface of the photonic chip 602 to the package substrate 601 (S604), as shown in FIG. 6(d).

As mentioned above with respect to FIG. 1, injection molding of chips is an important means to form a highly reliable package structure and solve the warping problem caused by thinning photonic chips. The injection molding material may be, for example, epoxy resin, which is injected into the first surface of the photonic chip in the molten state, and forms an injection molding material layer after curing, and the injection molding material layer 605 with the final shape as shown in FIG. 6(c) and the through hole 6051 therein may be formed by various methods.

In some embodiments, for example, the exposed areas on the first surface of the photonic chip can be covered with an injection molding material to form an injection molding material layer with a flat upper surface, and then the injection molding material in the area above the optical coupling adhesive layer can be removed by utilizing a suitable mechanical, chemical or optical etching method, thereby the through hole 6051 in the injection molding material layer 605 as shown in FIG. 6(c) is formed, and thus the optical coupling adhesive layer 606 is exposed in the through hole 6051.

Figure 7:
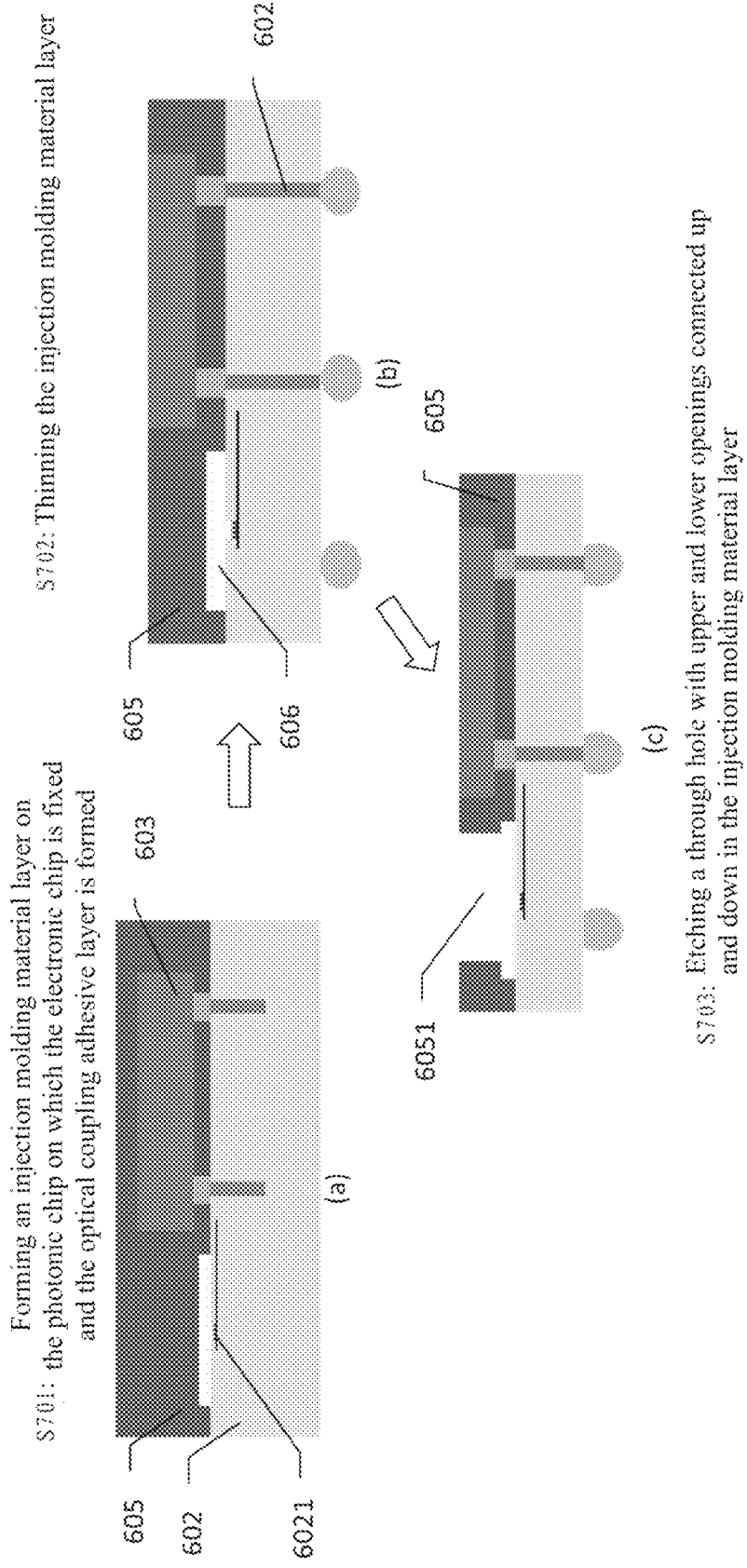
FIG. 7 shows an example process flowchart of forming an injection molding material layer of a three-dimensional packaging method of a photonic-electronic chip according to an embodiment of the present disclosure.

FIG. 7 shows an example process flowchart of forming an injection molding material layer of a three-dimensional packaging method 600 according to an embodiment of the present disclosure. The method steps S701-S703 shown in FIG. 7 are the detailed steps of step S603 in FIG. 6.

As shown in FIG. 7(a), firstly, forming an injection molding material layer 605 on the photonic chip 602 on which the electronic chip 603 is fixed and the optical coupling adhesive layer 606 is formed (S701), so that the injection molding material covers the electronic chip 603, the optical coupling adhesive layer 606 and the exposed areas of the first surface of the photonic chip 602.

Then, as shown in FIG. 7(b), thinning the injection molding material layer 605 and the electronic chip 603 (S702), so that the thinned injection molding material layer 605 and the electronic chip 603 have the same height, that is, the upper surfaces of the injection molding material layer 605 and the electronic chip 603 have the same height. For example, the injection molding material layer and the electronic chip can be thinned by using the mechanical grinding method as described with respect to FIG. 1. However, it should be understood that the thinning method of the present disclosure is not limited to thereto, for example, other methods can be used to thin the injection molding material layer and the electronic chip, including but not limited to precision cutting, chemical etching, etc.

Next, as shown in FIG. 7(c), etching the part of the injection molding material layer 605 above the optical coupling interface 6021, so that the part of the injection molding material layer 605 above the optical coupling interface 6021 forms the through hole 6051 with upper and lower openings connected up and down (S703). Wherein, the coverage area of the lower opening of the through hole 6051 covers the optical coupling interface 6021. The method of etching the injection molding material can include any suitable method, such as a method employing laser etching.

It should be noted that in some embodiments, step S612 corresponding to FIG. 7(b) can be omitted, that is, the injection molding material layer 605 can be etched without thinning the injection molding material layer and the electronic chip.

In the embodiment of FIG. 7, the optical coupling adhesive layer 606 can effectively protect the optical coupling interface 6021 from being damaged by the etching of the injection molding material layer.

Figure 8:
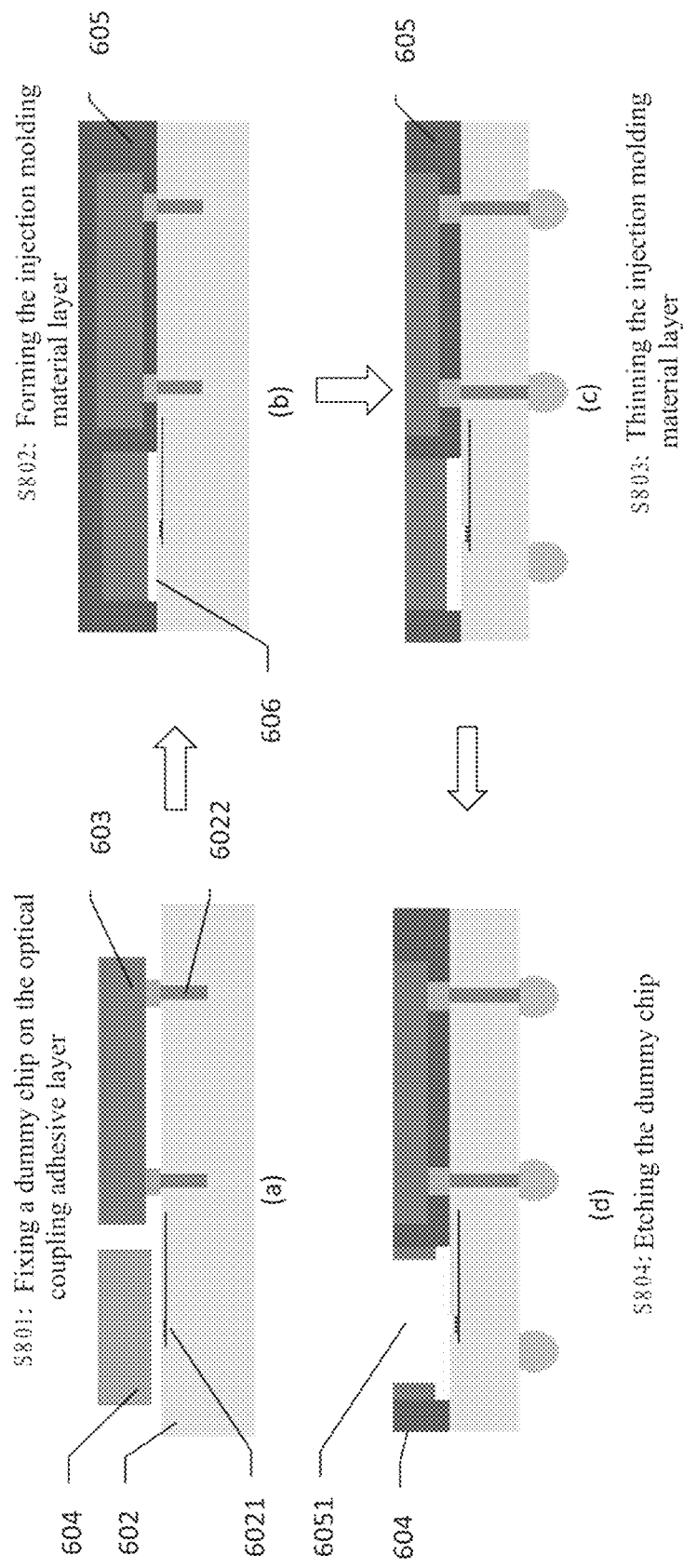
FIG. 8 shows another example process flowchart of a three-dimensional packaging method of a photonic-electronic chip according to an embodiment of the present disclosure.

FIG. 8 shows another example flowchart of a three-dimensional packaging method 600 according to an embodiment of the present disclosure. The method of FIG. 8 is the supplement and refinement of the method of FIG. 6, and the same method steps as those of FIG. 6 are not shown in FIG. 8. Steps S802-S803 in FIG. 8 are the detailed steps of step S603 in FIG. 6, and steps S801 and S804 in FIG. 8 are additional steps to those in FIG. 6.

As shown in FIG. 8(a), the packaging method 600 may further comprise: fixing a dummy chip 604 on the optical coupling adhesive layer 604 (S801). Different from the dummy chip 104 with a cavity in the method 100 shown in FIG. 1, the dummy chip 604 of this embodiment does not need to have a cavity, but may be a solid dummy chip, such as a solid cube, cuboid, cylinder, other polygonal cylinder structures or irregular structures. Of course, the dummy chip 604 may also have a cavity.

According to the embodiment, forming the injection molding material layer 605 on the first surface of the photonic chip 602 may comprise: forming the injection molding material layer 605 on the photonic chip 602 to which the electronic chip 603 and the dummy chip 604 are fixed, so that the injection molding material layer 605 covers the electronic chip 603, the dummy chip 604 and the exposed areas of the first surface of the photonic chip 602 (S802); and thinning the injection molding material layer 605 so that the part of the injection molding material layer 605 on the dummy chip 604 is removed (S803). Optionally, the dummy chip 604 and the electronic chip 603 can be thinned together so that the thinned dummy chip 604, the electronic chip 603 and the injection molding material layer 605 have the same height, that is, the heights of the upper surfaces of the three are the same. The thinning method can be similar to the method as described above with respect to FIG. 7(b), which will not be described here.

Next, etching the part of the thinned dummy chip 604 located above the optical coupling interface 6021 (S804), so that the dummy chip is completely etched out, or the dummy chip is partially etched to form a cavity with upper and lower openings connected up and down, and the coverage area of the lower opening of the cavity covers the optical coupling interface 6021. Note that, in order to simplify the description, FIG. 8(d) only shows an example of partially etched dummy chip. In the case that the dummy chip is completely etched out, a structure similar to that shown in FIG. 7(c) will be formed. The shape of the partially etched dummy chip 604 is similar to that described with respect to FIGS. 1, 4 and 5.

It should be understood that in the case that the dummy chip is partially etched, the through hole formed in the injection molding material layer is not completely hollow, but filled with the remaining part of the partially etched dummy chip. In other words, in the present disclosure, the through hole in the injection molding material layer is not required to be a cavity without filling, but only requires that there is no injection molding material in this space, in which air or other parts may be filled.

In the embodiment of FIG. 8, the optical coupling adhesive layer 606 can effectively protect the optical coupling interface 6021 from being damaged when the dummy chip is etched. Also, in the embodiment of FIG. 8, the dummy chip is covered on the optical coupling adhesive layer 606, and the damage to the optical coupling adhesive layer 606 caused by etching the dummy chip is less than that caused by etching the injection molding material layer.

FIG. 8 shows an example of the through hole in the injection molding material layer is partially filled. In some embodiments, the through hole can be completely filled with a suitable module, for example, a module with light guiding function can be filled to couple an external light source to an optical coupling interface in the photonic chip.

Figure 9:
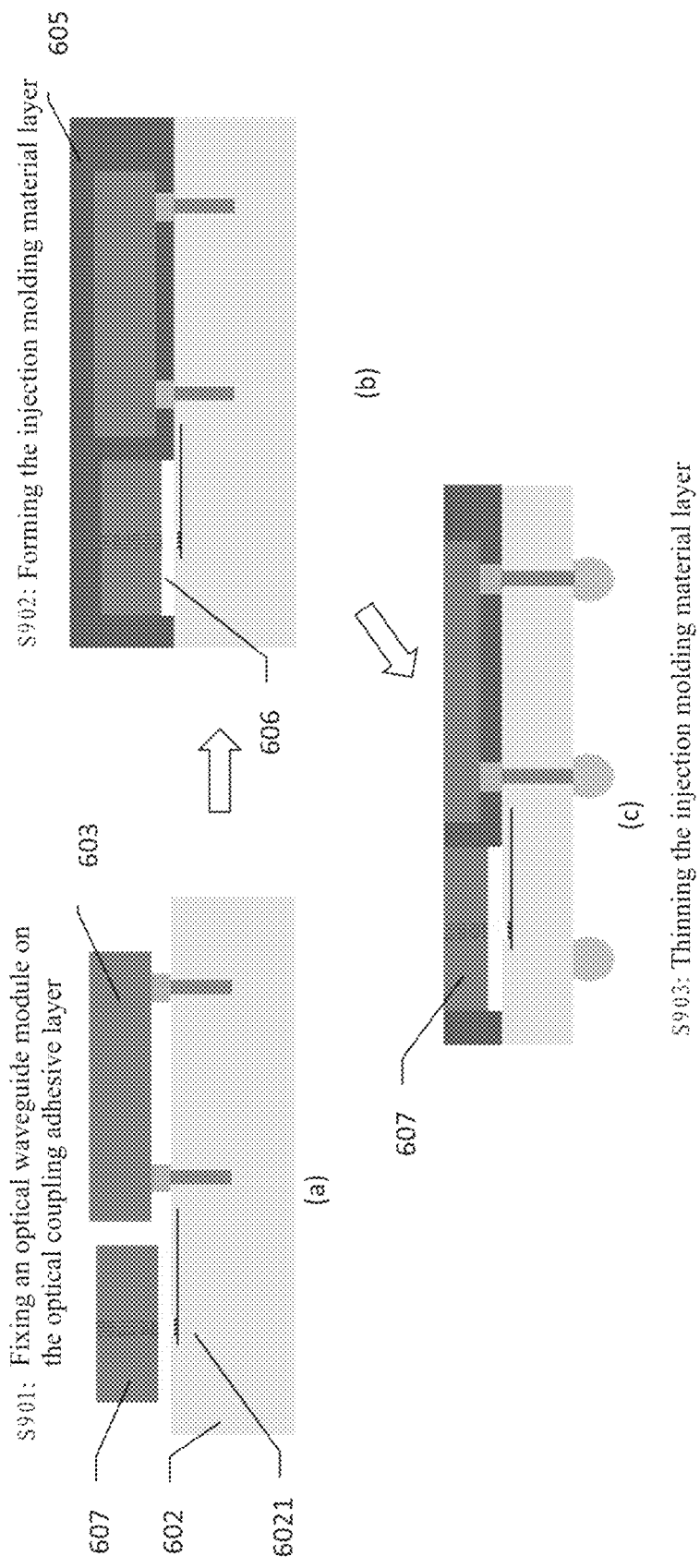
FIG. 9 shows another example process flowchart of a three-dimensional packaging method of a photonic-electronic chip according to an embodiment of the present disclosure.

FIG. 9 shows another flowchart of a three-dimensional packaging method 600 according to an embodiment of the present disclosure. The method of FIG. 9 is the supplement and refinement of the method of FIG. 6, and the same method steps as those of FIG. 6 are not shown in FIG. 9. Steps S902-S903 in FIG. 9 are the detailed steps of step S603 in FIG. 6, and step S901 in FIG. 9 is an additional step in addition to the steps in FIG. 6.

As shown in FIG. 9, the packaging method 600 may further comprise: fixing the optical waveguide module 607 on the optical coupling adhesive layer 607 (S901). The optical waveguide module 607 is used to couple light from the upper surface of the optical waveguide module 607 to the optical coupling interface 6021 corresponding to its lower surface. The optical waveguide module 607 can be any module with an optical waveguide therein, such as a silicon material waveguide or a silicon oxide material waveguide. For example, the optical waveguide module 607 may have a vertical optical waveguide (as shown by the dotted line in the optical waveguide module 607 in FIG. 9), the lower surface of which is coupled to the optical coupling interface 6021 by the optical coupling adhesive layer 606, and the upper surface of which is provided with an interface for coupling with an external optical input element (such as a laser light source or a fiber array).

According to this embodiment, forming the injection molding material layer 605 on the first surface of the photonic chip 602 comprises: forming the injection molding material layer 605 on the photonic chip 602 on which the electronic chip 603 and the optical waveguide module 607 are fixed, so that the injection molding material layer 605 covers the electronic chip 603, the optical waveguide module 607 and the exposed areas of the first surfaces of the photonic chip 602 (S902); and thinning the injection molding material layer 605 (S903), so that the part of the injection molding material layer 605 on the optical waveguide module 607 is removed. Also, optionally, the optical waveguide module 607 and the electronic chip 603 can be thinned together, so that the injection molding material layer 605, the optical waveguide module 607 and the electronic chip 603 have the same height. The thinning method is similar to that described above with respect to FIG. 7(b) and will not be repeated here.

In the embodiment of FIG. 9, the optical coupling adhesive layer 606 and the optical waveguide module 607 can effectively protect the optical coupling interface 6021 from being damaged when etching the injection molding material layer 605. Furthermore, the optical waveguide module 607 causes the interface where the external optical input element inputs an optical signal to the photonic chip 602 to be transferred to the top of the optical waveguide module 607, so that it is more convenient to couple the external optical input element. Moreover, the optical input interface of the optical waveguide module 607 can be easily repaired if it is damaged, for example, polishing the upper surface of the optical waveguide module 607 to repair the damage when thinning the optical waveguide module 607.

Referring back to FIG. 6, the photonic chip 602 in the embodiment of the present disclosure may further have an electric channel 6022 for electrically connecting the electronic chip 603 to the package substrate 601, and the electric channel 6022 is connected to the first metal bump on the first surface of the photonic chip 602. In some embodiments, fixing the electronic chip 603 on the first area of the first surface of the photonic chip 603 (S601) comprises: flip-chipping the electronic chip 603 to the first area of the first surface of the photonic chip 602, and a pin of the electronic chip 603 is bonded with the first metal bump.

In some embodiments, the electric channel 6022 in the photonic chip 602 is a conductive via, which is connected to an electric connection point on the package substrate 601 through a third metal bump on the second surface of the photonic chip 602 after the second surface of the photonic chip 602 is fixed on the package substrate 601.

The method of forming the conductive via is similar to the method previously described with respect to FIG. 3 and will not be repeated here.

Furthermore, in some embodiments, the three-dimensional packaging method shown in FIGS. 6-9 may further comprise: fixing the second surface of the photonic chip 602 to a support member before thinning the injection molding material layer 605; and separating the second surface of the photonic chip 602 from the support member before fixing the second surface of the photonic chip 602 on the package substrate 601. For example, by fixing the photonic chip to the support member, thinning the injection molding material layer, dummy chip, electronic chip and/or optical waveguide module can be facilitated. For example, the lower surface of the photonic chip can be fixed to a support member (for example, a carrier wafer) by an adhesive, and then the injection molding material layer and the dummy chip can be thinned by mechanical grinding. Other appropriate methods can also be used to thin the injection molding material layer, the dummy chip, the electronic chip and the optical waveguide module, including but not limited to precision cutting, chemical etching, etc.

It should be noted that the details of the three-dimensional packaging method described above with respect to FIGS. 1-3 are also applicable to the three-dimensional packaging method of the embodiments of FIGS. 6-9, unless otherwise stated herein or obviously inapplicable according to the context.

Figure 10:
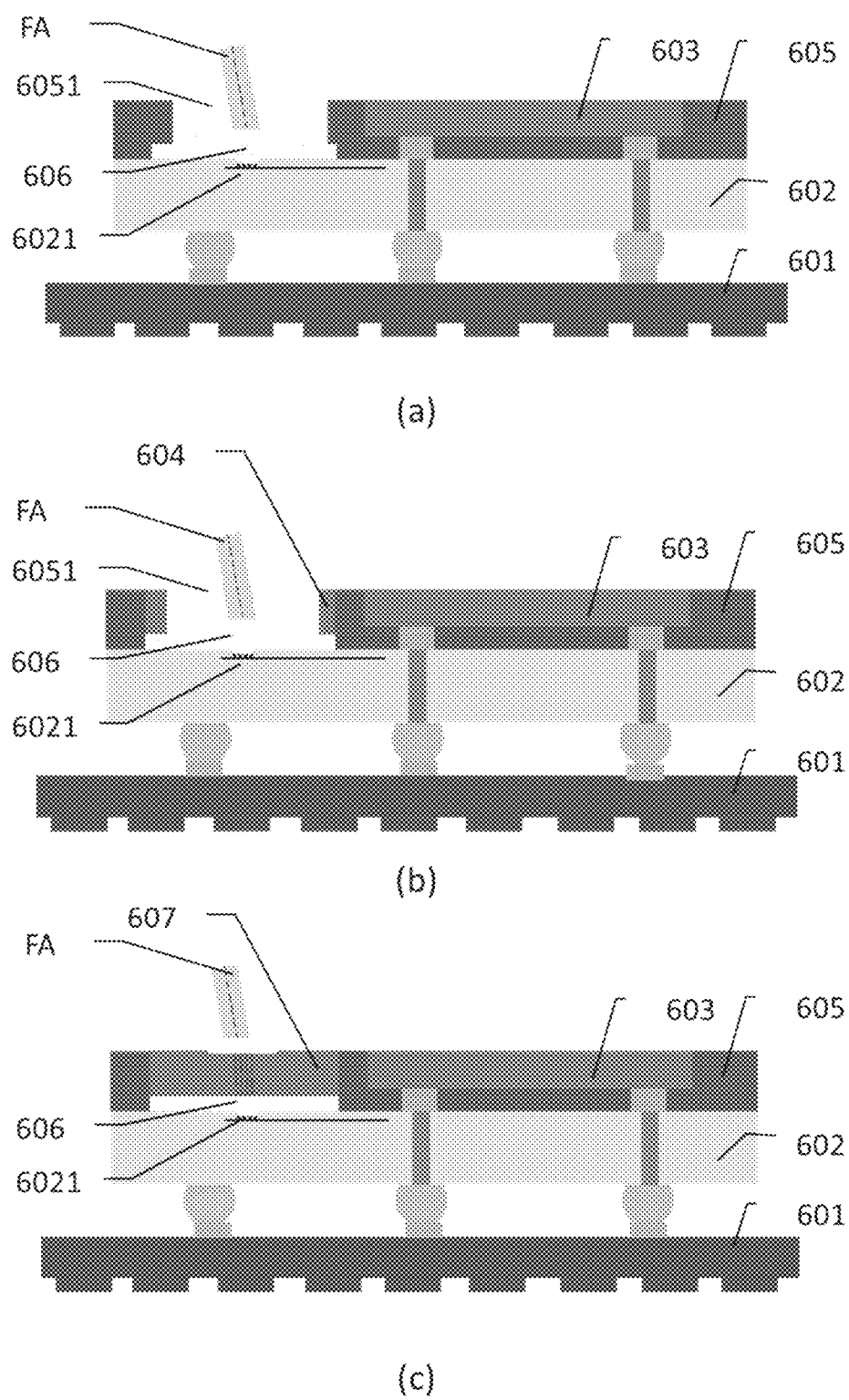
FIG. 10 shows an example diagram of a method of coupling a fiber array to a three-dimensional package structure of a photonic-electronic chip according to an embodiment of the present disclosure.

After fixing the photonic chip on the package substrate to form the three-dimensional package structure, the three-dimensional package method shown in FIGS. 6-9 may further comprise: coupling an optical input element to the three-dimensional package structure. FIG. 10 illustrates an example of a method of coupling a fiber array to a three-dimensional package of a photonic-electronic chip according to an embodiment of the present disclosure. For example, in the case where the through hole 6051 is formed in the injection molding material layer as shown in FIG. 7(c), the fiber array FA as the optical input element can be passed through the through hole 6051 of the injection molding material layer 605 and be coupled to the optical coupling interface 6021 using an optical coupling adhesive, as shown in FIG. 10(a). In the case that a dummy chip with a cavity is further included in the through hole 6051 formed on the injection molding material layer as shown in FIG. 8(d), the fiber array FA as the optical input element can be passed through the cavity of the dummy chip and coupled to the optical coupling interface 6021 using the optical coupling adhesive, as shown in FIG. 10(b). In the case that the optical waveguide module 607 is further included in the through hole 6051 formed on the injection molding material layer as shown in FIG. 9(c), the fiber array FA as the optical input element can be coupled to the upper surface of the optical waveguide module 607 using the optical coupling adhesive, as shown in FIG. 10(c). In some embodiments, in the case that the optical waveguide module 607 is further included in the through hole 6051 formed on the injection molding material layer as shown in FIG. 9(c), a laser, such as a vertical light emitting laser, can also be directly coupled to the upper surface of the optical waveguide module 607.

Various embodiments of protecting the optical coupling interface by forming the optical coupling adhesive layer on the optical coupling interface of the photonic chip are described above. It should be understood that although the above-mentioned three-dimensional packaging method of photonic-electronic chips is described regarding each example in the drawings, those skilled in the art can make various combinations or modifications to the processes, methods or flows in each example as required without departing from the concept of the present application, and the methods obtained from such combinations and modifications still fall within the scope of the present disclosure.

The three-dimensional package structure of the photonic-electronic chip formed by the above-mentioned various three-dimensional packaging methods will be described below.

Figure 11:
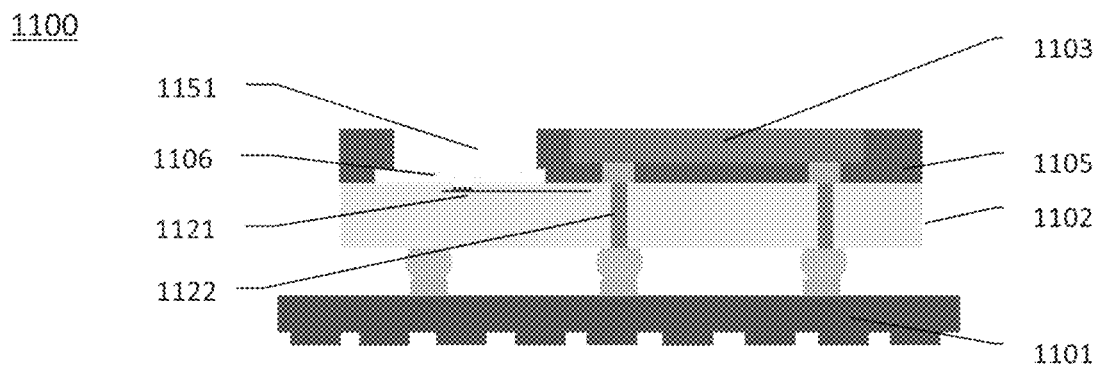
FIG. 11 shows an example diagram of a three-dimensional package structure of a photonic-electronic chip according to an embodiment of the present disclosure.

FIG. 11 shows an example of a three-dimensional package structure 1100 of a photonic-electronic chip according to an embodiment of the present disclosure.

As shown in FIG. 11, a three-dimensional package structure 1100 of a photonic-electronic chip comprises: a package substrate 1101 and a photonic chip 1102, the second surface of the photonic chip 1102 is fixed on the package substrate 1101; an electronic chip 1103 fixed on the first area of the first surface of the photonic chip 1102; an optical coupling adhesive layer 1106 fixed on the second area of the first surface of the photonic chip 1102, wherein the photonic chip 1102 is provided with an optical coupling interface 1121 at the second area; an injection material layer 1105, located on the first surface of the photonic chip 1102, surrounding the electronic chip 1103 and the optical coupling adhesive layer 1106, wherein the part of the injection material layer 1105 above the optical coupling interface 1121 has a through hole 1151 with upper and lower openings connected up and down, and the coverage area of the lower opening of the through hole 1151 covers the optical coupling interface 1121.

In some embodiments, the photonic chip 1102 has an electric channel 1122 for electrically connecting the electronic chip 1103 to the package substrate 1101, and the electric channel 1122 is connected with a first metal bump on the first surface of the photonic chip 1102. For example, the electronic chip 1103 is flip-chipped to the first area of the first surface of the photonic chip 1102, and a pin of the electronic chip 1103 is bonded with the first metal bump.

In some embodiments, the electric channel 1122 in the photonic chip 1102 is a conductive via, which cuts through the photonic chip 1102 and is connected to an electric connection point on the package substrate 1101 by a third metal bump 1124 on the second surface of the photonic chip 1102.

In some embodiments, the injection molding material layer 1105 and the electronic chip 1103 have the same height.

In some embodiments, the optical coupling interface 1121 is an optical coupling interface of a grating coupler.

In some embodiments, the three-dimensional package structure 1100 of the photonic-electronic chip may further include a fiber array FA, and the fiber array FA passes through the through hole 1151 of the injection molding material layer 1105 and is coupled to the optical coupling interface 1121 by optical coupling adhesive.

Figure 12:
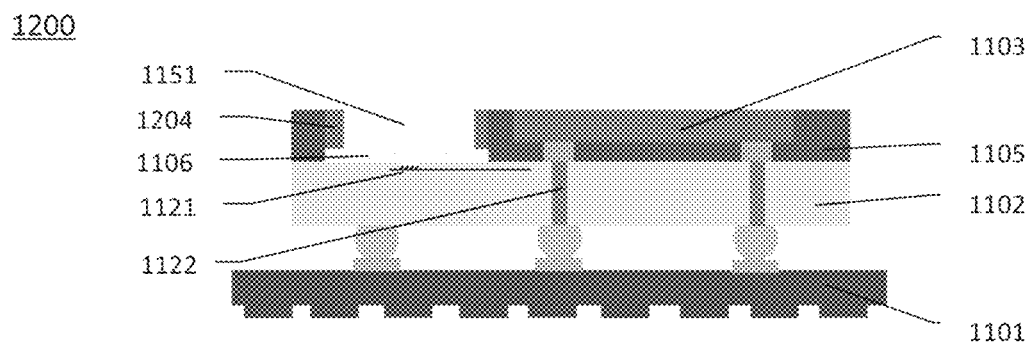
FIG. 12 shows an example diagram of a three-dimensional package structure comprising a dummy chip according to an embodiment of the present disclosure.

The three-dimensional package structure according to the embodiment of the present disclosure may further comprise a dummy chip. FIG. 12 illustrates an example of a three-dimensional package structure 1200 comprising the dummy chip according to the embodiment of the present disclosure.

Compared with FIG. 11, the three-dimensional package structure 1200 further comprises a dummy chip 1204 as shown in FIG. 12. The dummy chip 1204 is fixed on the optical coupling adhesive layer 1106, located inside the through hole 1151 and surrounded by the injection molding material layer 1105. The dummy chip 1204 has a cavity with upper and lower openings connected up and down at the portion above the optical coupling interface 1121, and the lower opening of the cavity covers the optical coupling interface 1121, and the cavity is not filled and covered by the injection molding material layer 1105.

In some embodiments, the dummy chip 1204, the injection material layer 1105 and the electronic chip 1103 have the same height.

The fiber array FA may be further included in the three-dimensional package structure 1200 shown in FIG. 12, which passes through the cavity of the dummy chip 1204 and is coupled to the optical coupling interface 1121 by optical coupling adhesive.

Figure 13:
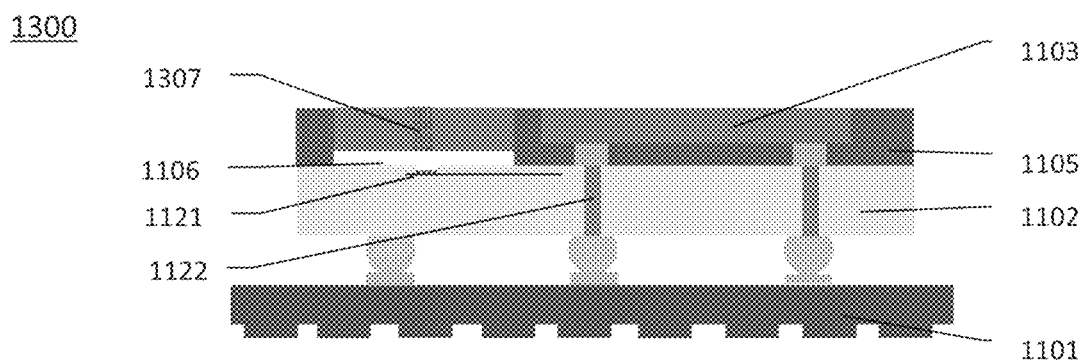
FIG. 13 shows an example diagram of a three-dimensional package structure comprising an optical waveguide module according to an embodiment of the present disclosure.

The three-dimensional package structure according to the embodiment of the present disclosure may further comprise an optical waveguide module. FIG. 13 shows an example of a three-dimensional package structure 1300 comprising the optical waveguide module according to an embodiment of the present disclosure.

Compared with FIG. 11, the three-dimensional package structure 1300 further comprises an optical waveguide module 1307 as shown in FIG. 13. The optical waveguide module 1307 is fixed on the optical coupling adhesive layer 1121, located inside the through hole and surrounded by the injection molding material layer 1105, and is used for coupling light from the upper surface of the optical waveguide module 1307 to the optical coupling interface 1121 corresponding to its lower surface.

In some embodiments, the optical waveguide module 1307, the injection molding material layer 1105 and the electronic chip 1103 have the same height.

In the three-dimensional package structure 1300 as shown in FIG. 13, a fiber array FA may be further included, and the fiber array FA is coupled to the upper surface of the optical waveguide module 1307 by optical coupling adhesive.

In some embodiments, in the case that the optical waveguide module 1307 is further included in the through hole formed by the injection molding material layer as shown in FIG. 13, the laser can be directly coupled to the upper surface of the optical waveguide module 1307, thereby light emitted by the laser can be directly provided to the optical waveguide module 1307.

It should be noted that the above detailed description of the three-dimensional packaging method with reference to FIGS. 6-9 is also applicable to the above-mentioned three-dimensional package structure with respect to FIGS. 11-13.

The embodiments of the present disclosure have been described in conjunction with the accompanying drawings. It should be understood that the embodiments described above are only illustrative, and those skilled in the art should understand that the combination of constituent elements and processing of the embodiments may be modified in various ways, and such modifications also fall within the scope of the present disclosure.

What is claimed is:

1. A three-dimensional packaging method of a photonic-electronic chip, comprising:
   providing a photonic chip with a first surface and a second surface which are opposite to each other;
   fixing a dummy chip on a second area of the first surface of the photonic chip, wherein the photonic chip is provided with an optical coupling interface at the second area, and the dummy chip has a single cavity with a single-sided opening, and the opening of the cavity faces and covers all of the optical coupling interface;
   forming an injection molding material layer on the photonic chip on which the dummy chip is fixed, so that the injection molding material layer covers the dummy chip and the exposed areas of the first surface of the photonic chip; and
   thinning the injection molding material layer and the dummy chip, so that the cavity of the dummy chip is connected up and down.

2. The three-dimensional packaging method of claim 1, wherein
   before the step of forming the injection molding material layer, the method further comprising a step of fixing an electronic chip on a first area of the first surface of the photonic chip; and the step of thinning the injection molding material layer and the dummy chip comprises thinning the injection molding material layer, the electronic chip and the dummy chip.

3. The three-dimensional packaging method of claim 2, wherein
fixing the second surface of the photonic chip on a package substrate after the step of thinning the injection molding material layer and the dummy chip so that the cavity of the dummy chip is connected up and down.

4. The three-dimensional packaging method of claim 3, wherein
the photonic chip has an electric channel for electrically connecting the electronic chip to the package substrate, and the electric channel is connected to a first metal bump provided on the first surface of the photonic chip;
the fixing an electronic chip on a first area of the first surface of the photonic chip comprises: flip-chipping the electronic chip to the first area of the first surface of the photonic chip, and bonding a pin of the electronic chip with the first metal bump;
the dummy chip has a dummy chip metal bump on a side with the opening; and
the fixing of the dummy chip on the second area of the first surface of the photonic chip comprises: bonding the dummy chip metal bump with a second metal bump on the photonic chip.

5. The three-dimensional packaging method of claim 4, wherein
the electric channel in the photonic chip is a conductive via, and the conductive via is connected to an electric connection point on the package substrate by a third metal bump on the second surface of the photonic chip after the second surface of the photonic chip is fixed on the package substrate.

6. The three-dimensional packaging method of claim 5, wherein,
before fixing the electronic chip and/or the dummy chip on the first area of the first surface of the photonic chip, the method further comprises: forming a metal blind via in the photonic chip, wherein the metal blind via cuts through the first surface of the photonic chip, and forming the first metal bump at the metal blind via on the first surface of the photonic chip;
after forming the injection molding material layer on the photonic chip, and before thinning the injection molding material layer and the dummy chip, the method further comprises: thinning the photonic chip from the second surface of the photonic chip so that the metal blind via cuts through the second surface of the photonic chip to form the conductive via, and forming the third metal bump at the conductive via on the second surface of the photonic chip; and
the fixing of the second surface of the photonic chip on the package substrate comprises bonding the third metal bump on the second surface of the photonic chip with the electric connection point on the package substrate.

7. The three-dimensional packaging method of claim 2, wherein,
thinning the injection molding material layer, the electronic chip and the dummy chip so that the injection molding material layer, the electronic chip and the dummy chip have the same height.

8. The three-dimensional packaging method of claim 2, further comprising:

fixing the second surface of the photonic chip to a support member before thinning the injection molding material layer, the electronic chip and the dummy chip; and
separating the second surface of the photonic chip from the support member before fixing the second surface of the photonic chip on the package substrate.

9. The three-dimensional packaging method of claim 2, further comprising:
passing a fiber array through the cavity of the dummy chip and coupling the fiber array to the optical coupling interface by using optical coupling adhesive after thinning the injection molding material layer and the dummy chip.

10. A three-dimensional package structure of a photonic-electronic chip, comprising:
a photonic chip having a first surface and a second surface opposite to each other;
a dummy chip fixed on a second area of the first surface of the photonic chip, the dummy chip is a wafer on which no photonic components or electronic components are integrated or included, wherein the photonic chip is provided with an optical coupling interface at the second area, and the dummy chip has a cavity with upper and lower openings connected up and down, and the lower opening of the cavity faces and covers the optical coupling interface; and
an injection molding material layer located on the first surface of the photonic chip and surrounds the dummy chip, and the cavity is not filled and covered by the injection molding material layer.

11. The three-dimensional package structure of claim 10, further comprising
an electronic chip fixed on a first area of the first surface of the photonic chip and surrounded by the injection molding material layer.

12. The three-dimensional package structure of claim 11, further comprising
a package substrate on which the second surface of the photonic chip is fixed;
the photonic chip has an electric channel for electrically connecting the electronic chip to the package substrate, and the electric channel is connected to a first metal bump provided on the first surface of the photonic chip.

13. The three-dimensional package structure of claim 12, wherein
the electric channel in the photonic chip is a conductive via, and the conductive via cuts through the photonic chip; and
the conductive via is connected to an electric connection point on the package substrate by a third metal bump on the second surface of the photonic chip.

14. The three-dimensional package structure of claim 11, wherein,
the injection molding material layer, the dummy chip and the electronic chip have the same height on a side away from the photonic chip.

15. The three-dimensional package structure of claim 10, wherein,
the optical coupling interface is an optical coupling interface of a grating coupler.

16. The three-dimensional package structure of claim 10, further comprising:
a fiber array which is coupled to the optical coupling interface through the cavity of the dummy chip.

17. A three-dimensional packaging method of a photonic-electronic chip, comprising:

providing a photonic chip with a first surface and a second surface which are opposite to each other;

forming an optical coupling adhesive layer on a second area of the first surface of the photonic chip, wherein the photonic chip is provided with an optical coupling interface at the second area, and the optical coupling adhesive layer covers the optical coupling interface, wherein the optical coupling adhesive layer is transparent after being cured; and forming an injection molding material layer on the first surface of the photonic chip, the injection molding material layer surrounds the optical coupling adhesive layer, wherein the part of the injection molding material layer above the optical coupling interface has a through hole with upper and lower openings connected up and down, and the coverage area of the lower opening of the through hole covers the optical coupling interface.

18. The three-dimensional packaging method of claim 17, further comprising:

fixing a dummy chip on the optical coupling adhesive layer;

wherein forming the injection molding material layer on the first surface of the photonic chip comprises:

forming the injection molding material layer on the photonic chip on which the dummy chip is fixed, so that the injection molding material layer covers the dummy chip and the exposed areas of the first surface of the photonic chip; and thinning the injection molding material layer so that the part of the injection molding material layer on the dummy chip is removed, and the method further comprises:

after thinning the injection molding material layer, etching the part of the dummy chip above the optical coupling interface, so that the dummy chip is completely etched out, or the dummy chip is partially etched to form a cavity with upper and lower openings connected up and down, and the coverage area of the lower opening of the cavity covers the optical coupling interface.

19. The three-dimensional packaging method of claim 18, further comprising:

thinning the injection molding material layer and the dummy chip, so that the injection molding material layer and the dummy chip have the same height on the side away from the photonic chip.

20. The three-dimensional packaging method of claim 17, wherein forming the injection molding material layer on the first surface of the photonic chip comprises:

forming the injection molding material layer on the photonic chip on which the optical coupling adhesive layer is formed, so that the injection molding material covers the optical coupling adhesive layer and the exposed areas of the first surface of the photonic chip; and etching the part of the injection molding material layer above the optical coupling interface, so that the part of the injection molding material layer above the optical coupling interface forms the through hole with upper and lower openings connected up and down, and the coverage area of the lower opening of the through hole covers the optical coupling interface.

21. The three-dimensional packaging method of claim 17, further comprising:

fixing an optical waveguide module on the optical coupling adhesive layer, the optical waveguide module is used for coupling light from the upper surface of the optical waveguide module to the optical coupling interface corresponding to the lower surface thereof;

wherein forming the injection molding material layer on the first surface of the photonic chip comprises:

forming an injection molding material layer on the photonic chip on which the optical waveguide module is fixed, so that the injection molding material layer covers the optical waveguide module and the exposed areas of the first surface of the photonic chip; and removing the part of the injection molding material layer on the optical waveguide module.

22. The three-dimensional packaging method of claim 17, wherein before the step of forming the injection molding material layer on the first surface of the photonic chip, the method further comprises a step of fixing the electronic chip on a first area of the first surface of the photonic chip.

23. The three-dimensional packaging method of claim 22, wherein the photonic chip has an electric channel for electrically connecting the electronic chip to the package substrate, and the electric channel is connected to a first metal bump provided on the first surface of the photonic chip; and the fixing the electronic chip on a first area of the first surface of the photonic chip comprises: flip-chipping the electronic chip to the first area of the first surface of the photonic chip, and bonding a pin of the electronic chip with the first metal bump.

24. The three-dimensional packaging method of claim 23, wherein the electric channel in the photonic chip is a conductive via, and the conductive via is connected to an electric connection point on the package substrate by a third metal bump on the second surface of the photonic chip after the second surface of the photonic chip is fixed on the package substrate.

25. The three-dimensional packaging method of claim 24, wherein, before fixing the electronic chip and/or the dummy chip on the first area of the first surface of the photonic chip, the method further comprises: forming a metal blind via in the photonic chip, wherein the metal blind via cuts through the first surface of the photonic chip, and forming the first metal bump at the metal blind via on the first surface of the photonic chip; and after forming the injection molding material layer on the photonic chip, and before thinning the injection molding material layer and the dummy chip, the method further comprises: thinning the photonic chip from the second surface of the photonic chip so that the metal blind via cuts through the second surface of the photonic chip to form the conductive via, and forming the third metal bump at the conductive via on the second surface of the photonic chip; and bonding the third metal bump on the second surface of the photonic chip with the electric connection point on the package substrate.

26. A three-dimensional package structure of a photonic-electronic chip, comprising:

a photonic chip having a first surface and a second surface opposite to each other;

an optical coupling adhesive layer fixed on a second area of the first surface of the photonic chip, wherein the photonic chip is provided with an optical coupling interface at the second area; and an injection molding material layer located on the first surface of the photonic chip, surrounding the optical coupling adhesive layer, wherein the part of the injection molding material layer above the optical coupling interface has a through hole with upper and lower openings connected up and down, and the coverage area of the lower opening of the through hole covers the optical coupling interface, wherein the optical coupling adhesive layer is transparent after being cured.

27. The three-dimensional package structure of claim 26, further comprising:
a dummy chip fixed on the optical coupling adhesive layer and located inside the through hole and surrounded by the injection molding material layer, and the dummy chip has a cavity with upper and lower openings connected up and down at the part above the optical coupling interface, the coverage area of the lower opening of the cavity covers the optical coupling interface, and the cavity is not filled and covered by the injection molding material layer.

28. The three-dimensional package structure of claim 27, further comprising:
an electronic chip fixed on the first area of the first surface of the photonic chip; and
a package substrate positioned on the second surface side of the photonic chip,
wherein the injection molding material layer, the dummy chip and the electronic chip have the same height on the side away from the photonic chip.

29. The three-dimensional package structure of claim 26, further comprising:
an optical waveguide module fixed on the optical coupling adhesive layer and located inside the through hole and surrounded by the injection molding material layer, the optical waveguide module is used for coupling light from the upper surface of the optical waveguide module to the optical coupling interface corresponding to the lower surface thereof.

30. The three-dimensional package structure of claim 29, further comprising:
a laser or a fiber array, which is coupled to the upper surface of the optical waveguide module by an optical coupling adhesive.

31. The three-dimensional package structure of claim 29, further comprising:
an electronic chip fixed on the first area of the first surface of the photonic chip; and
a package substrate positioned on the second surface side of the photonic chip,
wherein the injection molding material layer, the optical waveguide module and the electronic chip have the same height on the side away from the photonic chip.

32. The three-dimensional package structure of claim 26, further comprising:
an electronic chip fixed on the first area of the first surface of the photonic chip; and
a package substrate located on the second surface side of the photonic chip.

33. The three-dimensional package structure of claim 32, wherein
the photonic chip has an electric channel for electrically connecting the electronic chip to the package substrate, and the electric channel is connected to a first metal bump on the first surface of the photonic chip; and
the electronic chip is flip-chipped to the first area of the first surface of the photonic chip, and a pin of the electronic chip is bonded with the first metal bump.

34. The three-dimensional package structure of claim 33, wherein
the electric channel in the photonic chip is a conductive via, and the conductive via cuts through the photonic chip; and
the conductive via is connected to an electric connection point on the package substrate by a third metal bump on the second surface of the photonic chip.

35. The three-dimensional package structure of claim 32, wherein,
the injection molding material layer and the electronic chip have the same height on the side away from the photonic chip.

36. The three-dimensional packaging method of claim 21, further comprising:
thinning the injection molding material layer and the optical waveguide module, so that the injection molding material layer and the waveguide module have the same height on a side away from the photonic chip.

37. The three-dimensional package structure of claim 26, wherein,
the optical coupling interface is an optical coupling interface of a grating coupler.

38. The three-dimensional package structure of claim 26, further comprising:
a fiber array, which is coupled to the optical coupling interface by an optical coupling adhesive.

\* \* \* \* \*